US012805407B2

(12) United States Patent
Chung et al.

(10) Patent No.: US 12,805,407 B2
(45) Date of Patent: Nov. 17, 2026

(54) SEMICONDUCTOR DEVICE

(71) Applicant: SAMSUNG ELECTRONICS CO., LTD., Suwon-si (KR)

(72) Inventors: Hyunsoo Chung, Suwon-si (KR); Kwang-Soo Kim, Suwon-si (KR); Won-Young Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 361 days.

(21) Appl. No.: 18/581,483

(22) Filed: Feb. 20, 2024

(65) Prior Publication Data

US 2025/0054913 A1 Feb. 13, 2025

(30) Foreign Application Priority Data

Aug. 10, 2023 (KR) ........................ 10-2023-0104956

(51) Int. Cl.
*H10W 90/00* (2026.01)
*H10W 74/10* (2026.01)
*H10W 90/20* (2026.01)

(52) U.S. Cl.
CPC .......... *H10W 90/00* (2026.01); *H10W 74/114* (2026.01); *H10W 90/297* (2026.01); *H10W 90/792* (2026.01)

(58) Field of Classification Search
CPC ........................ H10W 90/791; H10W 90/792; H10W 90/798
See application file for complete search history.

(56) References Cited

U.S. PATENT DOCUMENTS

| | | | |
|---|---|---|---|
| 9,225,164 B2 | 12/2015 | Barber et al. | |
| 10,600,747 B2 | 3/2020 | Haba et al. | |
| 11,158,590 B1 | 10/2021 | Lan et al. | |
| 11,444,067 B2 | 9/2022 | Fay et al. | |
| 2016/0351472 A1 * | 12/2016 | Park ...................... | H10W 20/20 |
| 2022/0285273 A1 | 9/2022 | Dabral et al. | |
| 2022/0375851 A1 | 11/2022 | Choi et al. | |
| 2022/0384351 A1 | 12/2022 | Baek | |
| 2022/0415572 A1 | 12/2022 | Park | |
| 2022/0415854 A1 | 12/2022 | Dogiamis et al. | |
| 2023/0090121 A1 | 3/2023 | Delacruz et al. | |
| 2023/0092429 A1 | 3/2023 | Dutta et al. | |

* cited by examiner

*Primary Examiner* — Errol V Fernandes
(74) *Attorney, Agent, or Firm* — Morgan, Lewis & Bockius LLP

(57) ABSTRACT

A semiconductor device includes first to third semiconductor chips consecutively stacked. The first semiconductor chip comprises a first semiconductor substrate. A circuit layer is on a top surface of the first semiconductor substrate. First pads are on a top surface of the circuit layer. The first pads are electrically connected to the circuit layer. The second semiconductor chip comprises a second semiconductor substrate. Passive devices are in the second semiconductor substrate. Second pads are on a bottom surface of the second semiconductor substrate. The second pads are electrically connected to the passive devices. Third pads are on a top surface of the second semiconductor substrate. The third semiconductor chip comprises fourth pads on a bottom surface of the third semiconductor chip. The first pads and the second pads are directly connected to each other. The third pads and the fourth pads are directly connected to each other.

20 Claims, 23 Drawing Sheets

SEMICONDUCTOR DEVICE

CROSS-REFERENCE TO RELATED APPLICATIONS

This application claims priority under 35 U.S.C. § 119 to Korean Patent Application No. 10-2023-0104956, filed on Aug. 10, 2023 in the Korean Intellectual Property Office, the disclosure of which is incorporated by reference in its entirety herein.

1. TECHNICAL FIELD

The present disclosure relates to a directly-bonded semiconductor device and a method of fabricating the same.

2. DISCUSSION OF RELATED ART

A semiconductor package includes a semiconductor chip that may be easily applied to an electronic product. In general, the semiconductor package includes a printed circuit board (PCB) and a semiconductor chip. The semiconductor chip is mounted on the PCB and is electrically connected to the PCB using bonding wires or bumps. However, research is being conducted to increase the reliability and durability of the semiconductor package along with the development of the electronic industry.

In the semiconductor industry, various package technologies have been developed to provide a large capacity, reduced thickness, and a compact size of semiconductor devices and/or electronic products that the semiconductor devices are applied to. For example, a package technology of vertically stacking semiconductor chips is being research to provide a high-density chip stacking structure. This technology makes it possible to integrate semiconductor chips of various functions on a relatively small area, compared with a typical package provided in the form of a single semiconductor chip.

SUMMARY

An embodiment of the present inventive concept provides a semiconductor device with increased electrical characteristics and a method of fabricating the same.

An embodiment of the present inventive concept provides a semiconductor device with a reduced size and a method of fabricating the same.

According to an embodiment of the present inventive concept, a semiconductor device includes a first semiconductor chip and a second semiconductor chip on the first semiconductor chip. A third semiconductor chip is on the second semiconductor chip. The first semiconductor chip comprises a first semiconductor substrate. A circuit layer is on a top surface of the first semiconductor substrate. First pads are on a top surface of the circuit layer. The first pads are electrically connected to the circuit layer. The second semiconductor chip comprises a second semiconductor substrate. Passive devices are in the second semiconductor substrate. Second pads are on a bottom surface of the second semiconductor substrate. The second pads are electrically connected to the passive devices. Third pads are on a top surface of the second semiconductor substrate. The third semiconductor chip comprises fourth pads on a bottom surface of the third semiconductor chip. The first pads and the second pads are directly connected to each other on a contact surface between the first semiconductor chip and the second semiconductor chip. The third pads and the fourth pads are directly connected to each other on a contact surface between the second semiconductor chip and the third semiconductor chip.

According to an embodiment of the present inventive concept, a semiconductor device includes a logic chip. A passive device chip is on the logic chip. A chip stack is on the passive device chip. A front surface of the logic chip and a front surface of the passive device chip face each other and are in direct contact with each other. The chip stack comprises memory chips stacked on a rear surface of the passive device chip. A mold layer is on the rear surface of the passive device chip. The mold layer covers the memory chips. A lowermost one of the memory chips is directly mounted on the rear surface of the passive device chip. A width of the logic chip, a width of the passive device chip, and a width of the chip stack are equal to each other.

According to an embodiment of the present inventive concept, a semiconductor device includes a first semiconductor chip. A second semiconductor chip is on the first semiconductor chip. Third semiconductor chips are stacked on the second semiconductor chip. A mold layer is on the second semiconductor chip. The mold layer encloses the third semiconductor chips. The first semiconductor chip comprises a first semiconductor substrate. A logic circuit layer is on a top surface of the first semiconductor substrate. The second semiconductor chip comprises a second semiconductor substrate. A passive device is in the second semiconductor substrate. The passive device is disposed to be closer to a bottom surface of the second semiconductor substrate than to a top surface of the second semiconductor substrate. An interconnection layer is on the bottom surface of the second semiconductor substrate. The interconnection layer is electrically connected to the passive device. Penetration vias vertically penetrate the second semiconductor substrate. The penetration vias are electrically connected to the interconnection layer. The logic circuit layer and the interconnection layer are in direct contact with each other. The lowermost third semiconductor chip of the third semiconductor chips is mounted on the penetration vias or pads disposed on the top surface of the second semiconductor substrate to electrically connect with the penetration vias.

DETAILED DESCRIPTION OF EMBODIMENTS

Embodiments of the present inventive concept will now be described more fully with reference to the accompanying drawings, in which example embodiments are shown.

Figure 1:
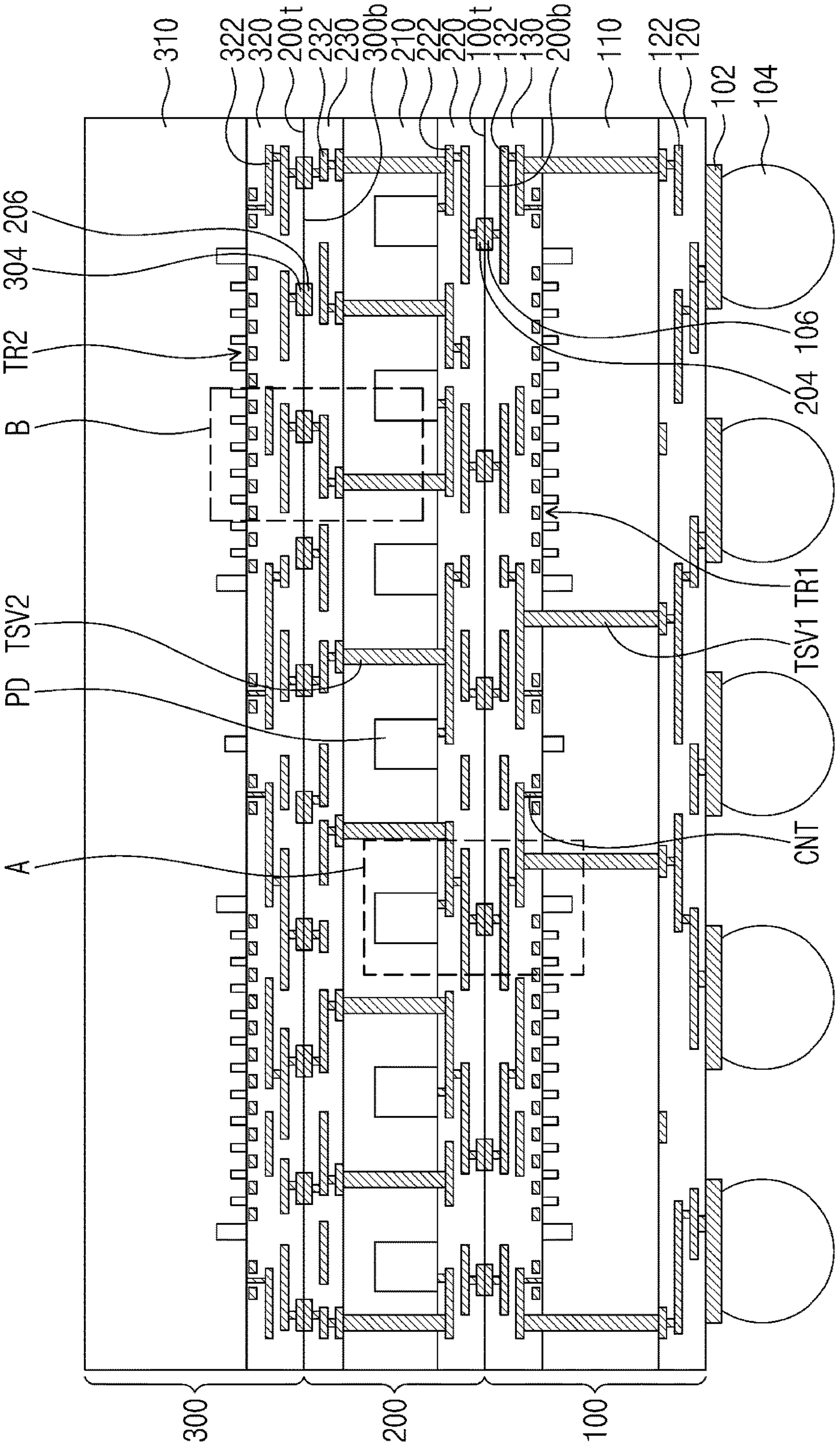
FIG. 1 is a cross-sectional view illustrating a semiconductor device according to an embodiment of the present inventive concept.
Figure 2:
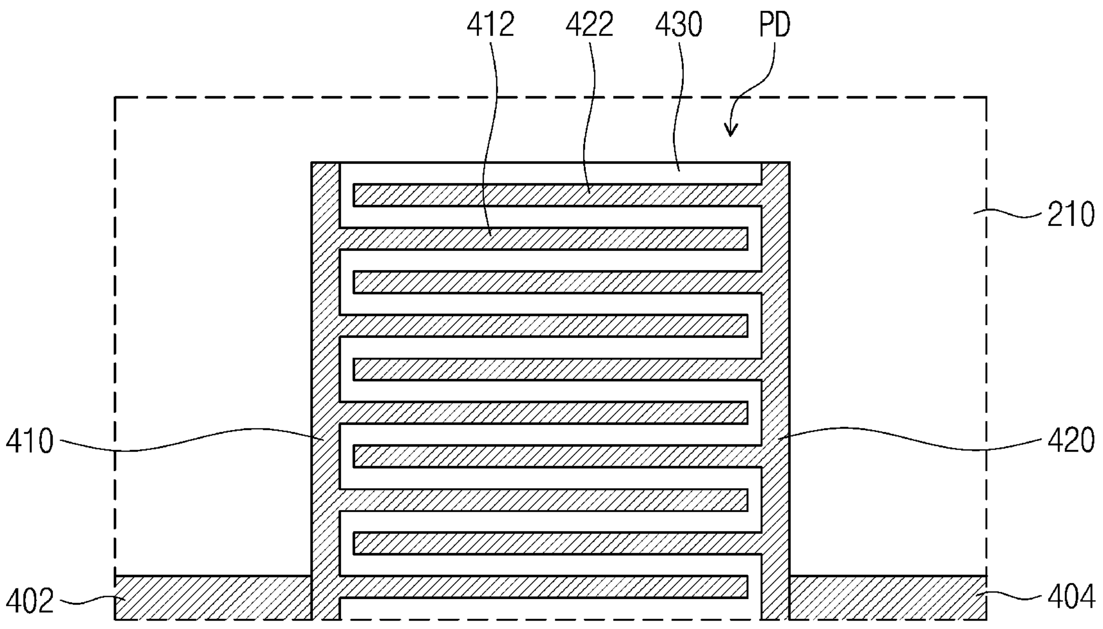
FIG. 2 is a diagram illustrating a passive device of a semiconductor device according to an embodiment of the present inventive concept.
Figure 3:
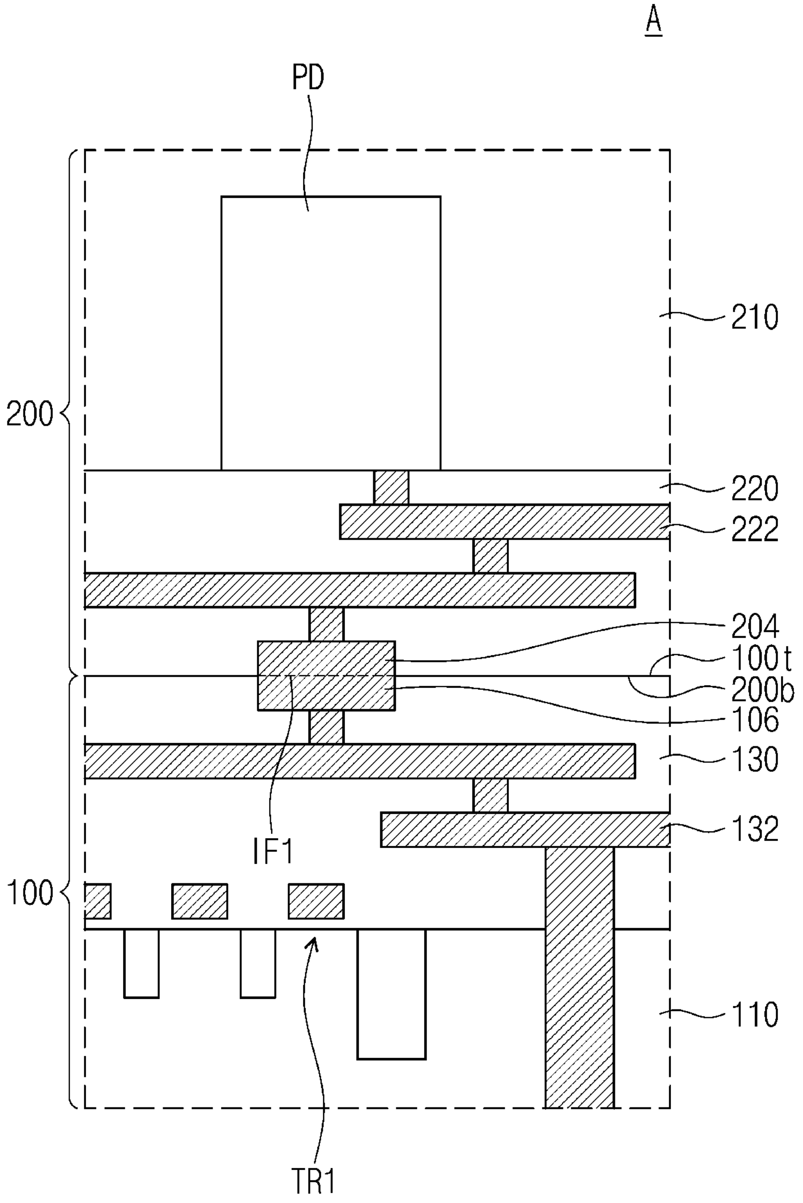
FIGS. 3 and 4 are enlarged cross-sectional views illustrating a portion A of FIG. 1.
Figure 4:
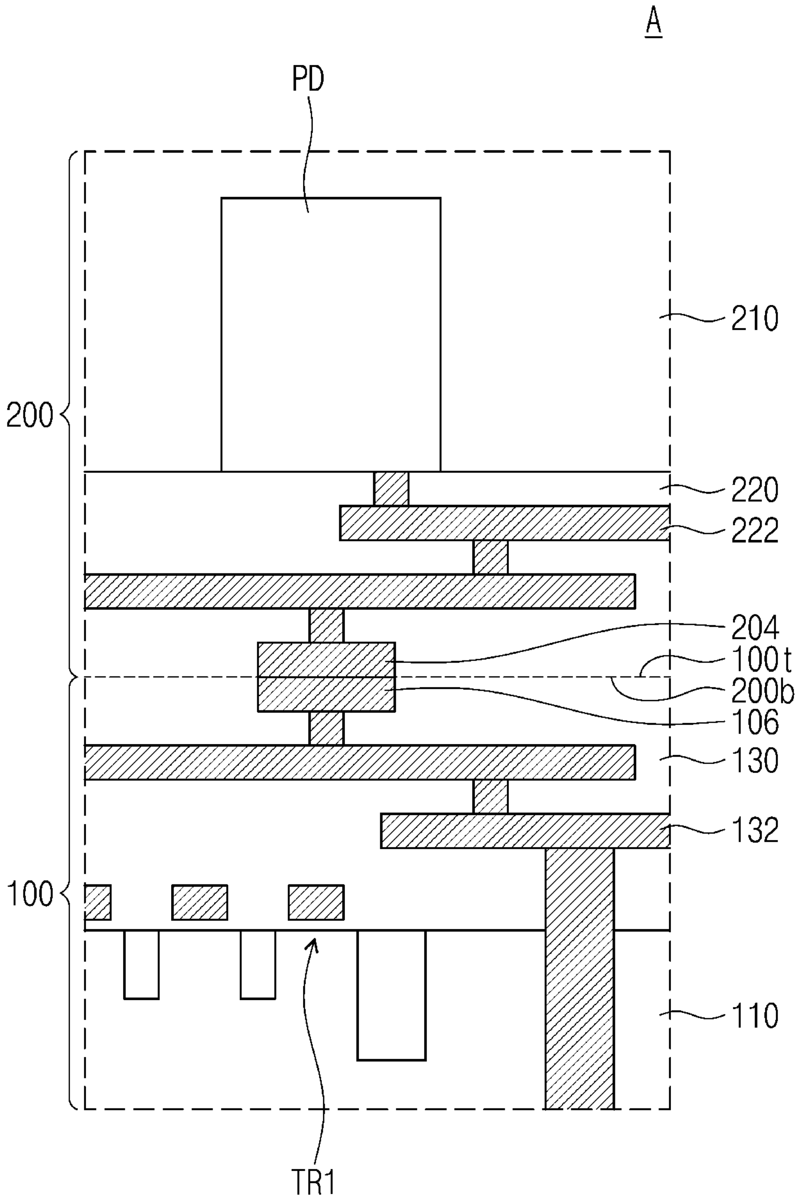
Figure 5:
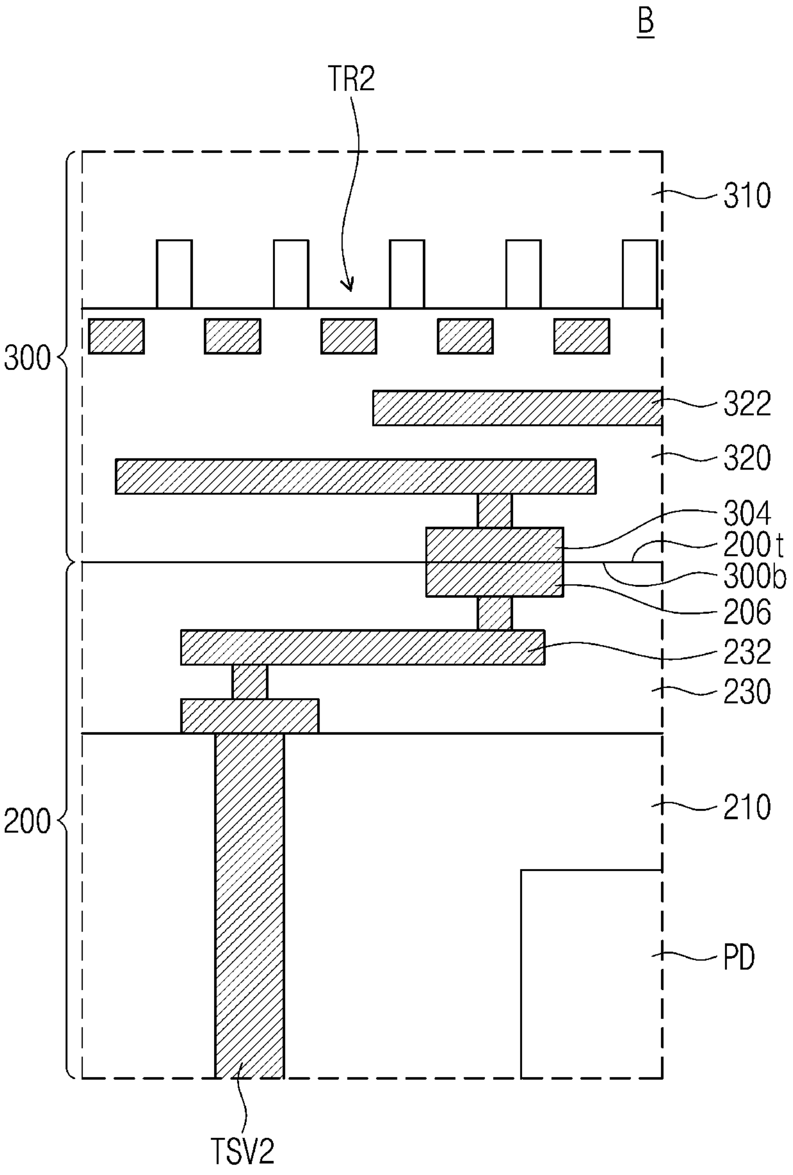
FIG. 5 is an enlarged cross-sectional view illustrating a portion B of FIG. 1.

FIG. 1 is a cross-sectional view illustrating a semiconductor device according to an embodiment of the present inventive concept. FIG. 2 is a diagram illustrating a passive device of a semiconductor device according to an embodiment of the present inventive concept. FIGS. 3 and 4 are enlarged cross-sectional views illustrating a portion A of FIG. 1. FIG. 5 is an enlarged cross-sectional view illustrating a portion B of FIG. 1.

Referring to FIG. 1, a semiconductor device may include a first semiconductor chip 100, a second semiconductor chip 200 on the first semiconductor chip 100, and a third semiconductor chip 300 on the second semiconductor chip 200. For example, the first to third semiconductor chips 100, 200, 300 may be sequentially stacked in a vertical direction. In an embodiment, the first to third semiconductor chips 100, 200, and 300 may be configured to have different functions from each other. In an embodiment, the first to third semiconductor chips 100, 200, and 300 may have the same width as each other. For example, the first to third semiconductor chips 100, 200, and 300 may have side surfaces (e.g., lateral side surfaces) that are vertically aligned to each other. The first and second semiconductor chips 100 and 200 may be bonded to each other. The second and third semiconductor chips 200 and 300 may be bonded to each other.

Hereinafter, the structure of the first to third semiconductor chips 100, 200, and 300 will be described in more detail with respect to an embodiment of FIG. 1.

The first semiconductor chip 100 may include a top surface 100*t*. The first semiconductor chip 100 may include first upper conductive pads 106, which are provided adjacent to the top surface 100*t*. In an embodiment, the first upper conductive pads 106 may be formed of or include at least one of metallic materials (e.g., copper (Cu)). For example, the first semiconductor chip 100 may be a logic chip.

The first semiconductor chip 100 may include a first semiconductor substrate 110, a first insulating layer 120 disposed on (e.g., disposed directly thereon) a bottom surface of the first semiconductor substrate 110, and a second insulating layer 130 disposed on (e.g., disposed directly thereon) a top surface of the first semiconductor substrate 110. A bottom surface of the first insulating layer 120 may correspond to a bottom surface of the first semiconductor chip 100. A top surface of the second insulating layer 130 may correspond to the top surface 100*t* of the first semiconductor chip 100.

The first semiconductor substrate 110 may include a semiconductor material. For example, in an embodiment the first semiconductor substrate 110 may be a silicon substrate.

A plurality of first transistors TR1 may be disposed on the first semiconductor substrate 110. For example, in an embodiment the first transistors TR1 may be formed on (e.g., disposed directly thereon) the top surface of the first semiconductor substrate 110. The first transistors TR1 may constitute a logic circuit.

The second insulating layer 130 may cover the top surface of the first semiconductor substrate 110, and in an embodiment, the second insulating layer 130 on the top surface of the first semiconductor substrate 110 may cover the first transistors TR1. In an embodiment, the second insulating layer 130 may be a multi-layered structure that is formed of or include at least one of silicon oxide (SiO), silicon nitride (SiN), silicon oxynitride (SiON), or porous insulating materials with low-k dielectric constants. A plurality of second interconnection patterns 132, which are stacked, may be disposed in the second insulating layer 130. The first transistors TR1, the second insulating layer 130, and the second interconnection patterns 132 may constitute a single circuit layer. The first transistors TR1 may be electrically connected to the second interconnection patterns 132 in the second insulating layer 130. The second interconnection patterns 132 may be electrically connected to the first upper conductive pads 106. For example, the second interconnection patterns 132 may be connected to the first transistors TR1 through connection contacts CNT. In an embodiment, some of the first upper conductive pads 106 may be exposed to the outside of the first semiconductor chip 100 near the top surface 100*t* of the first semiconductor chip 100, which is the top surface of the second insulating layer 130, and may be co-planar with the top surface 100*t* (e.g., in the vertical direction).

The first insulating layer 120 may cover the bottom surface of the first semiconductor substrate 110. In an embodiment, the first insulating layer 120 may be a multi-layered structure that is formed of or include at least one of silicon oxide (SiO), silicon nitride (SiN), silicon oxynitride (SiON), or porous insulating materials with low-k dielectric constants. First interconnection patterns 122, which are stacked to form a multi-layered structure, may be disposed in the first insulating layer 120. The first interconnection patterns 122 may be electrically connected to outer pads 102 that are provided on (e.g., disposed directly on) a bottom surface of the first semiconductor chip 100, which is the bottom surface of the first insulating layer 120. FIG. 1 illustrates an example in which the outer pads 102 are separately provided below the first insulating layer 120. However, embodiments of the present inventive concept are not necessarily limited thereto. In an embodiment, the outer pads 102 may be portions of the first interconnection patterns 122, which are exposed to the outside from the first insulating layer 120 near the bottom surface of the first insulating layer 120.

First penetration vias TSV1 may be disposed in the first semiconductor substrate 110 to penetrate the first semiconductor substrate 110. The first penetration vias TSV1 may be arranged to penetrate a portion of the second insulating layer 130 (e.g., in a vertical direction) and may be electrically connected to the second interconnection patterns 132 or the first upper conductive pads 106. In an embodiment, the first penetration vias TSV1 may be physically and electrically connected to the first interconnection patterns 122, at an interface between the first semiconductor substrate 110 and the first insulating layer 120. Alternatively, the first penetration vias TSV1 may be arranged to penetrate a portion of the first insulating layer 120 and may be physically and electrically connected to the first interconnection patterns 122. The first transistors TR1 may be connected to the outer pads 102 through the connection contacts CNT, the second interconnection patterns 132, the first penetration vias TSV1, and the first interconnection patterns 122 or may be electrically connected to the first upper conductive pads 106 through the connection contacts CNT and the second interconnection patterns 132.

Outer terminals 104 may be disposed below the first insulating layer 120. Each of the outer terminals 104 may be coupled to (e.g., directly coupled thereto) a corresponding one of the outer pads 102. In an embodiment, the outer terminals 104 may include solder balls or solder bumps.

In an embodiment, the second semiconductor chip 200 may include a bottom surface 200*b* in direct contact with the first semiconductor chip 100 and a top surface 200*t* in direct contact with the third semiconductor chip 300. In an embodiment, the second semiconductor chip 200 may include second upper conductive pads 206, which are disposed adjacent to the top surface 200*t*. The second semiconductor chip 200 may include first lower conductive pads 204, which are disposed adjacent to the bottom surface 200*b*. In an embodiment, the first lower conductive pads 204 may be in direct contact with the first upper conductive pads 106. In an embodiment, the first lower conductive pads 204 and the first upper conductive pads 106 may be formed of or include at least one of metallic materials (e.g., copper (Cu)). In an embodiment, the second semiconductor chip 200 may be a passive device chip, in which passive devices PD for operations of the first semiconductor chip 100 are provided. For example, the second semiconductor chip 200 may be a chip including a capacitor. However, embodiments of the present inventive concept are not necessarily limited thereto.

In an embodiment, the second semiconductor chip 200 may include a second semiconductor substrate 210, a third insulating layer 220 disposed on (e.g., disposed directly thereon) a bottom surface of the second semiconductor substrate 210, and a fourth insulating layer 230 disposed on (e.g., disposed directly thereon) a top surface of the second semiconductor substrate 210. A bottom surface of the third insulating layer 220 may correspond to the bottom surface 200*b* of the second semiconductor chip 200. A top surface of the fourth insulating layer 230 may correspond to the top surface 200*t* of the second semiconductor chip 200.

The second semiconductor substrate 210 may include a semiconductor material. For example, in an embodiment the second semiconductor substrate 210 may be a silicon substrate.

A plurality of passive devices PD may be disposed on the second semiconductor substrate 210. For example, in an embodiment the passive devices PD may be formed on (e.g., disposed directly thereon) the bottom surface of the second semiconductor substrate 210. The passive devices PD may include a capacitor. An example of the passive devices PD will be described in more detail with respect to FIG. 2. Hereinafter, the structure of the passive devices PD will be described with reference to one of the passive devices PD.

The passive device PD may be a capacitor that is disposed in a recess formed on the bottom surface of the second semiconductor substrate 210. In an embodiment, the passive device PD may include a first electrode 410 and a second electrode 420, which are horizontally spaced apart from each other in the recess, and a dielectric material 430, which is provided to fill a space between the first and second electrodes 410 and 420.

The first and second electrodes 410 and 420 may be connected to first and second passive device pads 402 and 404, respectively, which are formed in the bottom surface of the second semiconductor substrate 210. The first and second passive device pads 402 and 404 may be some of third interconnection patterns 222 in the third insulating layer 220, which will be described below. In an embodiment, each of the first and second passive device pads 402 and 404 may extend towards the recess on the bottom surface of the second semiconductor substrate 210 and may be in direct contact with the first and second electrodes 410 and 420.

To increase an electrostatic capacitance of the passive device PD, the passive device PD may further include first sub-electrodes 412 and second sub-electrodes 422, which are alternately provided between the first and second electrodes 410 and 420. The first sub-electrodes 412 may be connected to the first electrode 410, and the second sub-electrodes 422 may be connected to the second electrode 420.

In an embodiment, the passive device PD may be a capacitor that is formed on the bottom surface of the second semiconductor substrate 210. For example, in an embodiment the first and second electrodes 410 and 420 may be spaced apart from each other (e.g., vertically spaced apart from each other, etc.), and a dielectric material may be disposed between the first and second electrodes 410 and 420. In an embodiment, the first and second electrodes 410 and 420 may be connected to passive device pads, which are provided on (e.g., disposed directly thereon) the bottom surface of the second semiconductor substrate 210, through penetration vias vertically penetrating the passive device PD. In an embodiment, the penetration via may include an insulating layer, which is provided to enclose an outer side surface thereof.

So far, an example of the structure of the passive device PD has been described. However, embodiments of the present inventive concept are not necessarily limited to this example. For example, the passive device PD may include various devices, such as capacitors, resistors, and inductors.

According to an embodiment of the present inventive concept, the passive devices PD may be provided as a layer or chip that is distinct from logic circuits or the first and third semiconductor chips 100 and 300 with logic circuits. Thus, the passive devices PD may be provided to have a relatively large size, area, and/or depth. Accordingly, it may be possible to increase the electrostatic capacitance of the passive device PD and thereby to increase the electrical characteristics of the semiconductor device. In an embodiment, the passive devices PD may be disposed to be closer to the bottom surface of the second semiconductor substrate 210 than to the top surface of the second semiconductor substrate 210.

Referring further to FIG. 1, the third insulating layer 220 may cover the bottom surface of the second semiconductor substrate 210, and in an embodiment, the third insulating layer 220 may cover the passive devices PD, on the bottom surface of the second semiconductor substrate 210. In an embodiment, the third insulating layer 220 may be a multi-layered structure that is formed of or include at least one of silicon oxide (SiO), silicon nitride (SiN), silicon oxynitride (SiON), or porous insulating materials with low-k dielectric constants. The third interconnection patterns 222, which are stacked to form a multi-layered structure, may be disposed in the third insulating layer 220. The passive devices PD may be electrically connected to the third interconnection patterns 222 in the third insulating layer 220. For example, the third interconnection patterns 222 may be connected to the first and second passive device pads 402 and 404 of the passive devices PD using connection contacts or may be directly connected to the first and second passive device pads 402 and 404. The third interconnection patterns 222 may be electrically connected to the first lower conductive pads 204. In an embodiment, some of the first lower conductive pads 204 may be exposed to the outside of the second semiconductor chip 200 near the bottom surface 200*b* of the second semiconductor chip 200, which is a bottom surface of the third insulating layer 220, and may be co-planar with the bottom surface 200*b* (e.g., in the vertical direction).

The fourth insulating layer 230 may cover the top surface of the second semiconductor substrate 210. In an embodiment, the fourth insulating layer 230 may be a multi-layered structure that is formed of or include at least one of silicon oxide (SiO), silicon nitride (SiN), silicon oxynitride (SiON), or porous insulating materials with low-k dielectric constants. Fourth interconnection patterns 232, which are stacked to form a multi-layered structure, may be disposed in the fourth insulating layer 230. The fourth interconnection patterns 232 may be electrically connected to the second upper conductive pads 206. In an embodiment, some of the second upper conductive pads 206 may be exposed to the outside of the second semiconductor chip 200 near the top surface 200*t* of the second semiconductor chip 200, which is a top surface of the fourth insulating layer 230, and may be co-planar with the top surface 200*t* (e.g., in the vertical direction).

A second penetration via TSV2 may be disposed in the second semiconductor substrate 210 to penetrate the second semiconductor substrate 210 (e.g., in the vertical direction). The second penetration via TSV2 may be arranged to partially penetrate the third insulating layer 220 and may be electrically connected to the third interconnection patterns 222 or the first lower conductive pads 204. At an interface between the second semiconductor substrate 210 and the fourth insulating layer 230, the second penetration vias TSV2 may be electrically connected to the fourth interconnection patterns 232. Alternatively, the second penetration vias TSV2 may be arranged to penetrate a portion of the fourth insulating layer 230 and may be electrically connected to the fourth interconnection patterns 232. The passive devices PD may be electrically connected to the first transistors TR1 through the third interconnection patterns 222 and the second interconnection patterns 132. The passive devices PD may be electrically connected to the second upper conductive pads 206 through the third interconnection patterns 222, the second penetration vias TSV2, and the fourth interconnection patterns 232. The first transistors TR1 may be electrically connected to the second upper conductive pads 206 through the second interconnection patterns 132, the third interconnection patterns 222, and the fourth interconnection patterns 232.

In an embodiment, the second semiconductor chip 200 may not include the fourth insulating layer 230 and the fourth interconnection patterns 232, unlike that shown in an embodiment of FIG. 1.

Referring to FIG. 3, the second semiconductor chip 200 may be disposed on (e.g., disposed directly thereon) the first semiconductor chip 100. A front surface of the first semiconductor chip 100 may face a front surface of the second semiconductor chip 200. Here, the front surface may be defined as a surface, on which semiconductor elements, interconnection lines, or pads are integrated or mounted, and a rear surface may be defined as surface of the semiconductor substrate that is opposite to the front surface. For example, a surface of the first semiconductor substrate 110 with the first transistors TR1 may face a surface of the second semiconductor substrate 210 with the passive devices PD.

In an embodiment, the second semiconductor chip 200 may be directly bonded to the first semiconductor chip 100. For example, in an embodiment at an interface (e.g., a contact surface) between the first and second semiconductor chips 100 and 200, the first lower conductive pads 204 of the second semiconductor chip 200 and the first upper conductive pads 106 of the first semiconductor chip 100 may form an inter-metal hybrid bonding structure. In the present specification, the hybrid bonding structure may mean a bonding structure which is formed by two materials, which are of the same kind and are fused at an interface therebetween, or by the interfacial fusion between a first constituent containing a first material and a second constituent containing a second material which is a compound of the first material. For example, in an embodiment the first lower conductive pads 204 and the first upper conductive pads 106 may be in direct contact with each other and may form a continuous structure, and in this embodiment, an interface IF1 between the first lower conductive pads 204 and the first upper conductive pads 106 may not be visible or observable. In an embodiment, a passivation layer may not be interposed between the first and second semiconductor chips 100 and 200.

In an embodiment, as shown in FIG. 4, at an interface between the first and second semiconductor chips 100 and 200, the second insulating layer 130 of the first semiconductor chip 100 may be bonded to the third insulating layer 220 of the second semiconductor chip 200. In an embodiment, the second and third insulating layers 130 and 220 may form a hybrid bonding structure of oxide, nitride, or oxynitride. For example, the second and third insulating layers 130 and 220, which are bonded to each other, may have a continuous structure, and an interface between the second and third insulating layers 130 and 220 may not be visible or observable. For example, in an embodiment the second and third insulating layers 130 and 220 may be formed of the same material, and there may be no interface between the second and third insulating layers 130 and 220. Thus, the second and third insulating layers 130 and 220 may be provided as a single element. For example, the second and third insulating layers 130 and 220 may be bonded to form a single object (e.g., an object having an integral structure). However, embodiments of the present inventive concept are not necessarily limited thereto. For example, in some embodiments the second and third insulating layers 130 and 220 may be formed of different materials. In this embodiment, the second and third insulating layers 130 and 220 may not have a continuous structure, and there may be a visible or observable interface between the second and third insulating layers 130 and 220.

According to an embodiment of the present inventive concept, the passive devices PD may be provided as a layer or chip that is distinct from the first and third semiconductor chips 100 and 300 with logic circuits or memory circuits. Thus, the passive devices PD may be freely disposed in the second semiconductor chip 200, and the layout of the passive devices PD may be arranged to reduce a length of an electrical path to the first transistors TR1 in the first semiconductor chip 100. Furthermore, since the first semiconductor chip 100 with the logic circuits is directly bonded to the second semiconductor chip 200 with the passive devices PD in a face-to-face manner, a length of an electrical path between the first transistors TR1 and the passive devices PD may be further reduced. Accordingly, a semiconductor device with increased electrical characteristics may be provided.

Referring further to FIG. 1, the third semiconductor chip 300 may include a bottom surface 300*b* in direct contact with the second semiconductor chip 200. The third semiconductor chip 300 may include second lower conductive pads 304, which are disposed adjacent to the bottom surface 300*b*. The second lower conductive pads 304 may be in direct contact with the second upper conductive pads 206. In an embodiment, the second lower conductive pads 304 and the second upper conductive pads 206 may be formed of or include at least one of metallic materials (e.g., copper (Cu)). In an embodiment, the third semiconductor chip 300 may be a memory chip that is used to store data produced in the first semiconductor chip 100. For example, in an embodiment the third semiconductor chip 300 may be a DRAM chip. Alternatively, the third semiconductor chip 300 may be a logic chip, a memory chip, or combinations thereof.

In an embodiment, the third semiconductor chip 300 may include a third semiconductor substrate 310 and a fifth insulating layer 320 disposed on a bottom surface of the third semiconductor substrate 310. A bottom surface of the fifth insulating layer 320 may correspond to the bottom surface 300*b* of the third semiconductor chip 300.

The third semiconductor substrate 310 may include a semiconductor material. For example, in an embodiment the third semiconductor substrate 310 may be a silicon substrate.

A plurality of second transistors TR2 may be disposed on the third semiconductor substrate 310. For example, the second transistors TR2 may be formed on (e.g., disposed directly thereon) the bottom surface of the third semiconductor substrate 310. In an embodiment, the second transistors TR2 may form a memory circuit.

The fifth insulating layer 320 may be arranged to cover the bottom surface of the third semiconductor substrate 310, and in an embodiment, the fifth insulating layer 320 on the bottom surface of the third semiconductor substrate 310 may cover the second transistors TR2. In an embodiment, the fifth insulating layer 320 may be a multi-layered structure that is formed of or include at least one of silicon oxide (SiO), silicon nitride (SiN), silicon oxynitride (SiON), or porous insulating materials with low-k dielectric constants. Fifth interconnection patterns 322, which are stacked to form a multi-layered structure, may be disposed in the fifth insulating layer 320. The second transistors TR2, the fifth insulating layer 320, and the fifth interconnection patterns 322 may form a single circuit layer. The second transistors TR2 may be electrically connected to the fifth interconnection patterns 322 in the fifth insulating layer 320. The fifth interconnection patterns 322 may be electrically connected to the second lower conductive pads 304. For example, the fifth interconnection patterns 322 may be connected to the second transistors TR2 through connection contacts. In an embodiment, some of the second lower conductive pads 304 may be exposed to the outside of the third semiconductor chip 300 near the bottom surface 300*b* of the third semiconductor chip 300, which is the bottom surface of the fifth insulating layer 320, and may be co-planar with the bottom surface 300*b* (e.g., in the vertical direction).

Referring to FIG. 5, the third semiconductor chip 300 may be disposed on (e.g., disposed directly thereon) the second semiconductor chip 200. A rear surface of the second semiconductor chip 200 may face a front surface of the third semiconductor chip 300. For example, a surface of the second semiconductor substrate 210, on which the passive devices PD are not formed, may face a surface of the third semiconductor substrate 310, on which the second transistors TR2 are formed.

The third semiconductor chip 300 may be directly bonded to the second semiconductor chip 200. In an embodiment, at an interface (e.g., a contact surface) between the second and third semiconductor chips 200 and 300, the second lower conductive pads 304 of the third semiconductor chip 300 and the second upper conductive pads 206 of the second semiconductor chip 200 may form an inter-metal hybrid bonding structure. For example, in an embodiment the second lower conductive pads 304 and the second upper conductive pads 206 may be in direct contact with each other and may form a continuous structure, and in this embodiment, an interface between the second lower conductive pads 304 and the second upper conductive pads 206 may not be visible or observable. A passivation layer may not be interposed between the second and third semiconductor chips 200 and 300.

In an embodiment in which the second semiconductor chip 200 does not include the fourth insulating layer 230 and the fourth interconnection patterns 232, the third semiconductor chip 300 may be mounted on (e.g., mounted directly thereon) the second penetration vias TSV2 of the second semiconductor chip 200. For example, at an interface between the second and third semiconductor chips 200 and 300, the second lower conductive pads 304 may be in direct contact with the second penetration vias TSV2, and the second lower conductive pads 304 and the second penetration vias TSV2 may form an inter-metal hybrid bonding structure.

In an embodiment, at an interface between the second and third semiconductor chips 200 and 300, the fourth insulating layer 230 of the second semiconductor chip 200 may be bonded to the fifth insulating layer 320 of the third semiconductor chip 300. For example, in an embodiment the fourth and fifth insulating layers 230 and 320 may form a hybrid bonding structure of oxide, nitride, or oxynitride. For example, the fourth and fifth insulating layers 230 and 320, which are bonded to each other, may have a continuous structure, and an interface between the fourth and fifth insulating layers 230 and 320 may not be visible or observable. For example, in an embodiment the fourth and fifth insulating layers 230 and 320 may be formed of the same material, and there may be no interface between the fourth and fifth insulating layers 230 and 320. Thus, the fourth and fifth insulating layers 230 and 320 may be provided as a single element. For example, the fourth and fifth insulating layers 230 and 320 may be bonded to form a single object. However, embodiments of the present inventive concept are not necessarily limited thereto. For example, in an embodiment the fourth and fifth insulating layers 230 and 320 may be formed of different materials from each other. In this embodiment, the fourth and fifth insulating layers 230 and 320 may not have a continuous structure, and there may be a visible or observable interface between the fourth and fifth insulating layers 230 and 320.

According to an embodiment of the present inventive concept, the third semiconductor chip 300 with the memory circuits may be directly bonded to the second semiconductor chip 200 and may be connected to the first semiconductor chip 100 through the second penetration vias TSV2 of the second semiconductor chip 200. For example, since the first to third semiconductor chips 100, 200, and 300 are directly bonded to each other and are electrically connected to each other through the penetration vias TSV1 and TSV2, the lengths of the electrical paths between the first to third semiconductor chips 100, 200, and 300 may be reduced. This may make it possible to realize the semiconductor device with increased electrical characteristics.

In the description of the embodiments to be explained below, an element previously described with reference to FIGS. 1 to 5 may be identified by the same reference number without repeating an overlapping description thereof, for concise description.

Figure 6:
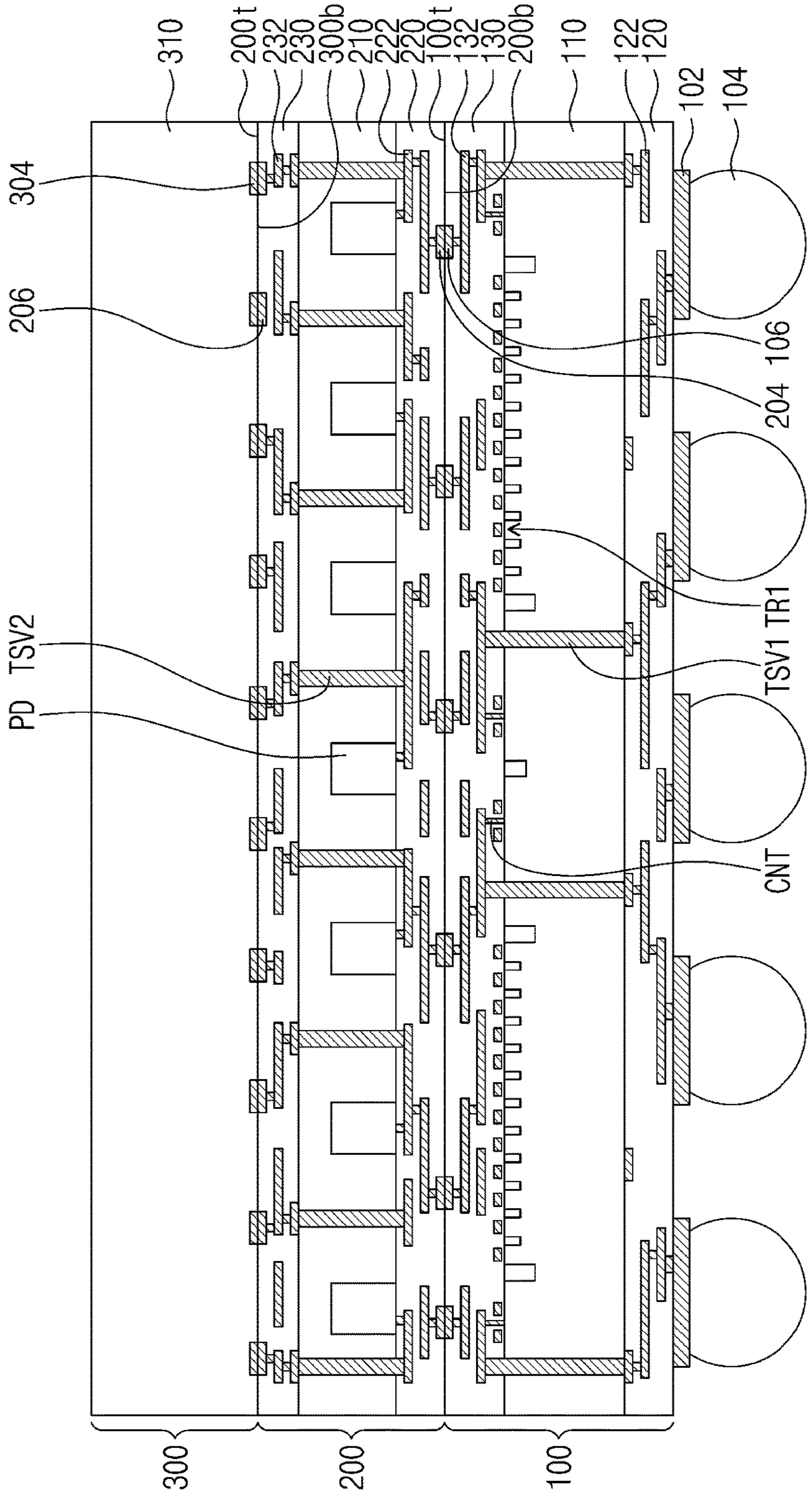
FIGS. 6 to 10 are cross-sectional views illustrating a semiconductor device according to embodiments of the present inventive concept.

FIG. 6 is a cross-sectional view illustrating a semiconductor device according to an embodiment of the present inventive concept.

Referring to FIG. 6, the third semiconductor chip 300 may be a dummy semiconductor chip, unlike embodiments shown in FIGS. 1 to 5.

The third semiconductor chip 300 may include the third semiconductor substrate 310. A bottom surface of the third semiconductor substrate 310 may correspond to the bottom surface 300*b* of the third semiconductor chip 300. The third semiconductor substrate 310 may include a semiconductor material. For example, the third semiconductor substrate 310 may be a silicon substrate. For example, in an embodiment the third semiconductor chip 300 may be a chip of bulk silicon. Alternatively, the third semiconductor substrate 310 may be formed of or include a material with high thermal conductivity.

The third semiconductor chip 300 may include the second lower conductive pads 304, which are disposed adjacent to the bottom surface 300*b*. For example, in an embodiment the second lower conductive pads 304 may be disposed below the third semiconductor substrate 310. In an embodiment, bottom surfaces of the second lower conductive pads 304 may be co-planar with the bottom surface of the third semiconductor substrate 310 (e.g., in the vertical direction).

In some embodiments, the second lower conductive pads 304 may be arranged to protrude above the bottom surface of the third semiconductor substrate 310. In this embodiment, a passivation layer may be disposed on the bottom surface of the third semiconductor substrate 310. The passivation layer may enclose the second lower conductive pads 304 and may have a bottom surface that is co-planar (e.g., in the vertical direction) with bottom surfaces of the second lower conductive pads 304. The following description will be given based on the embodiment of FIG. 6.

Since the second and third semiconductor chips 200 and 300 are directly bonded to each other, the fourth insulating layer 230 of the second semiconductor chip 200 may be in direct contact with the third semiconductor substrate 310 of the third semiconductor chip 300.

The third semiconductor chip 300 may be directly bonded to the second semiconductor chip 200. In an embodiment, at an interface between the second and third semiconductor chips 200 and 300, the second lower conductive pads 304 of the third semiconductor chip 300 and the second upper conductive pads 206 of the second semiconductor chip 200 may form an inter-metal hybrid bonding structure. For example, the second lower conductive pads 304 and the second upper conductive pads 206 may be in direct contact with each other and may form a continuous structure, and in this embodiment, an interface between the second lower conductive pads 304 and the second upper conductive pads 206 may not be visible or observable.

According to an embodiment of the present inventive concept, the third semiconductor chip 300, which is a dummy semiconductor chip, may be disposed on the first and second semiconductor chips 100 and 200. Thus, it may be possible to easily exhaust heat, which is generated in the first and second semiconductor chips 100 and 200, to a region on the semiconductor device through the third semiconductor chip 300. For example, since the third semiconductor chip 300 is directly bonded to the second semiconductor chip 200 that has the second penetration vias TSV2 extending towards the third semiconductor chip 300, the heat may be more effectively transferred to the third semiconductor chip 300. Thus, the semiconductor device may have increased heat-dissipation efficiency.

Figure 7:
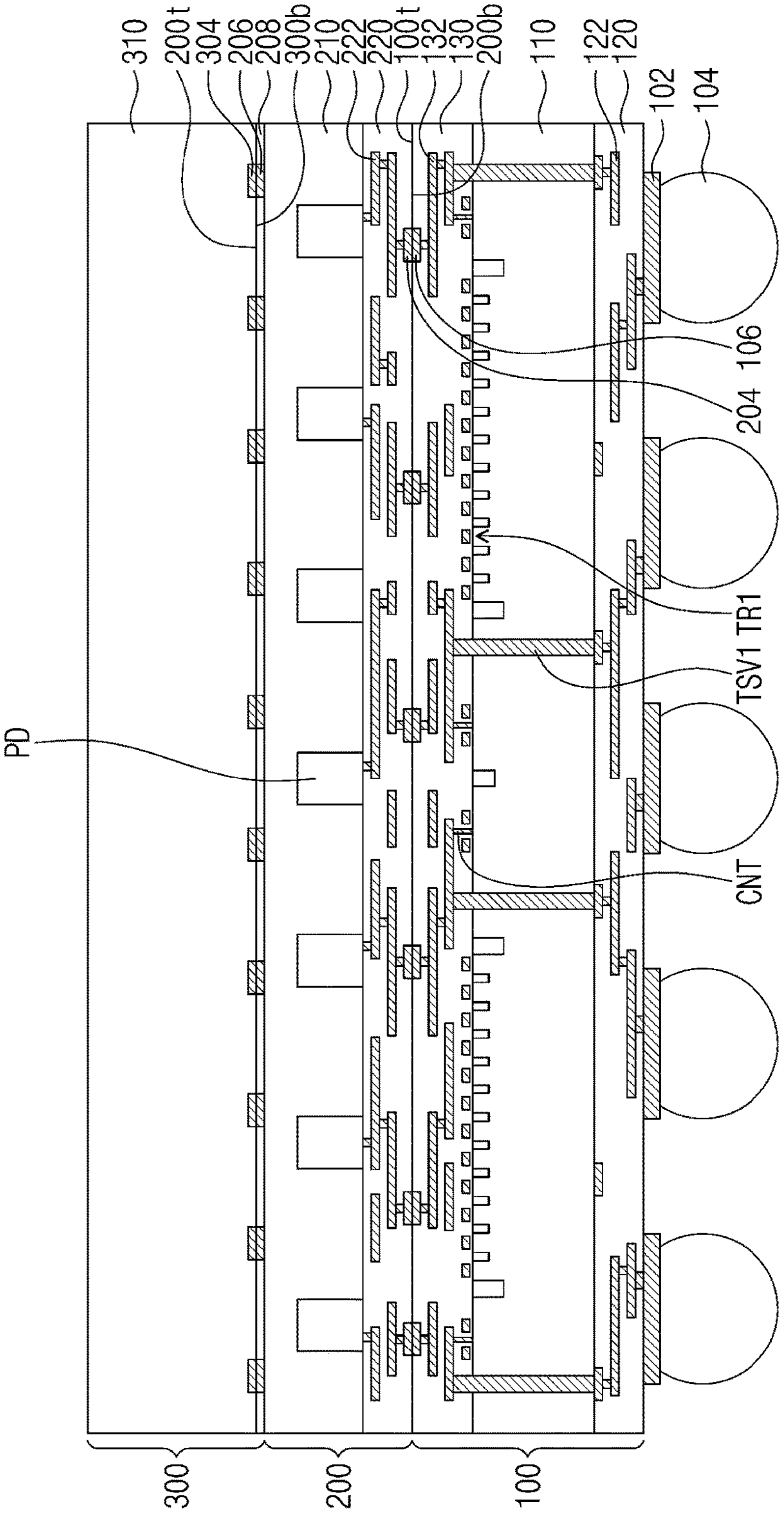

FIG. 7 is a cross-sectional view illustrating a semiconductor device according to an embodiment of the present inventive concept.

Referring to FIG. 7, in an embodiment the third semiconductor chip 300 may be a dummy semiconductor chip. The third semiconductor chip 300 may have the same or similar structure as the third semiconductor chip 300 described with reference to an embodiment shown in FIG. 6. For example, the third semiconductor chip 300 may include the third semiconductor substrate 310 and may have the second lower conductive pads 304, which are disposed on a bottom surface of the third semiconductor substrate 310.

The second semiconductor chip 200 may have a similar structure to the second semiconductor chip 200 described with reference to embodiments shown in FIGS. 1 to 5 but may not have the second penetration vias TSV2 and the fourth insulating layer 230. For example, in an embodiment the second upper conductive pads 206 of the second semiconductor chip 200 may be disposed on (e.g., disposed directly thereon) a top surface of the second semiconductor substrate 210. The second upper conductive pads 206 may be arranged as protruding patterns, which are disposed on the top surface of the second semiconductor substrate 210 and extend above the top surface of the second semiconductor substrate 210. In this embodiment, a passivation layer 208 may be disposed on the top surface of the second semiconductor substrate 210. The passivation layer 208 on the top surface of the second semiconductor substrate 210 may enclose the protruding patterns of the second upper conductive pads 206. In an embodiment, a top surface of the passivation layer 208 may be co-planar (e.g., in the vertical direction) with top surfaces of the second upper conductive pads 206. The top surface of the passivation layer 208 may correspond to the top surface 200*t* of the second semiconductor chip 200.

Since the second and third semiconductor chips 200 and 300 are directly bonded to each other, the passivation layer 208 of the second semiconductor chip 200 and the third semiconductor substrate 310 of the third semiconductor chip 300 may be in direct contact with each other.

The third semiconductor chip 300 may be directly bonded to the second semiconductor chip 200. For example, at an interface between the second and third semiconductor chips 200 and 300, the second lower conductive pads 304 of the third semiconductor chip 300 and the second upper conductive pads 206 of the second semiconductor chip 200 may form an inter-metal hybrid bonding structure. For example, in an embodiment the second lower conductive pads 304 and the second upper conductive pads 206 may be in direct contact with each other and may form a continuous structure, and in this embodiment, an interface between the second lower conductive pads 304 and the second upper conductive pads 206 may not be visible or observable.

Figure 8:
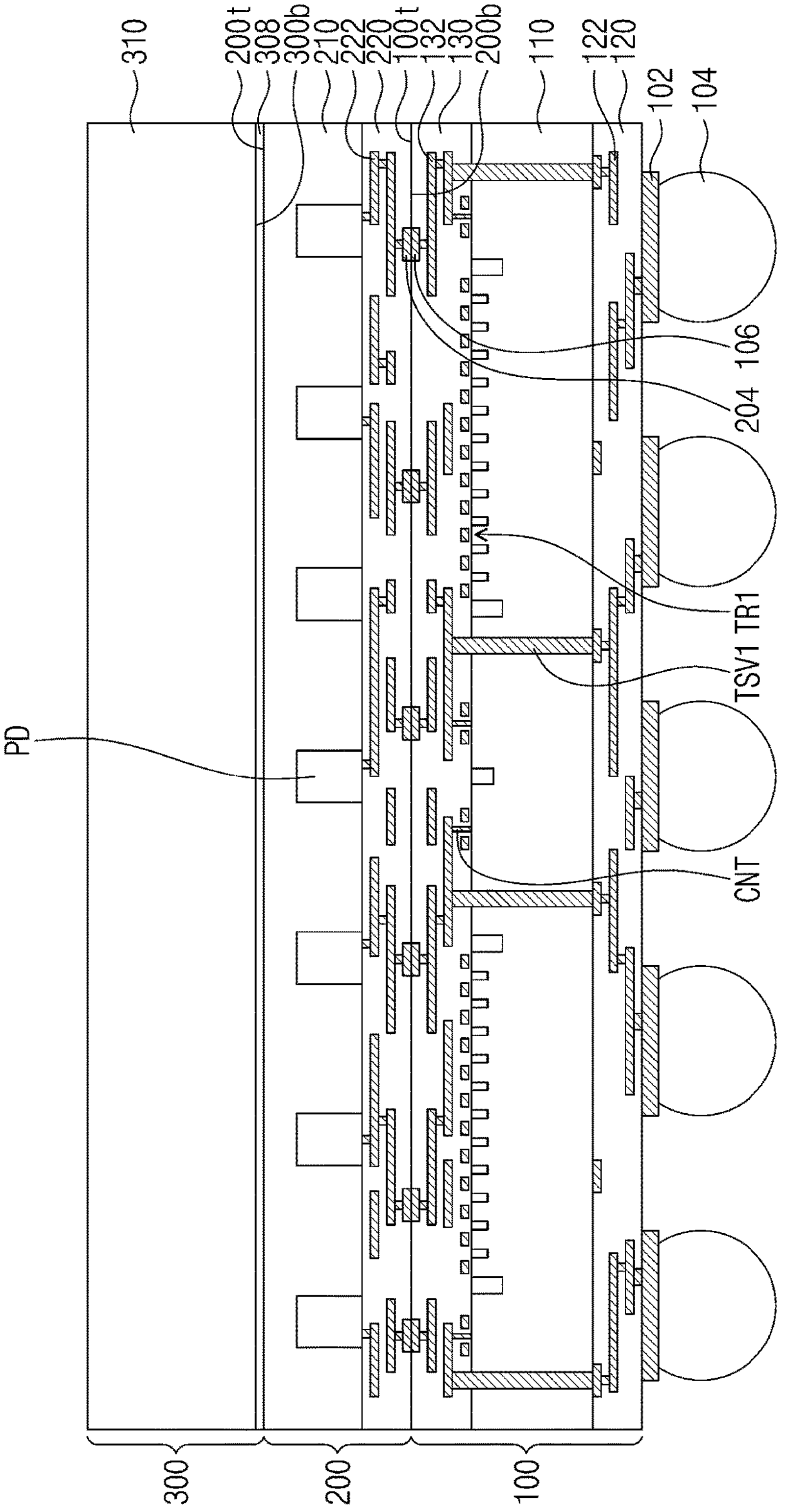

FIG. 8 is a cross-sectional view illustrating a semiconductor device according to an embodiment of the present inventive concept.

Referring to FIG. 8, the third semiconductor chip 300 may be a dummy semiconductor chip. The third semiconductor chip 300 may have a similar structure to the third semiconductor chip 300 described with reference to an embodiment shown in FIG. 6 and may not have the second lower conductive pads 304. For example, the third semiconductor chip 300 may include the third semiconductor substrate 310. A bottom surface of the third semiconductor substrate 310 may correspond to the bottom surface 300*b* of the third semiconductor chip 300.

In an embodiment, the second semiconductor chip 200 may have a similar structure to the second semiconductor chip 200 described with reference to embodiments shown in FIGS. 1 to 5 but may not have the second upper conductive pads 206, the second penetration vias TSV2, and the fourth insulating layer 230. A top surface of the second semiconductor substrate 210 may correspond to the top surface 200*t* of the second semiconductor chip 200.

In an embodiment, the third semiconductor chip 300 and the second semiconductor chip 200 may be attached to each other using an adhesive layer 308. The adhesive layer 308 may be attached to the top surface 200*t* of the second semiconductor chip 200 and the bottom surface 300*b* of the third semiconductor chip 300.

According to an embodiment of the present inventive concept, the third semiconductor chip 300 may be attached to the second semiconductor chip 200 using only the adhesive layer 308. Thus, an additional bonding structure or process may not be required to bond the second and third semiconductor chips 200 and 300 to each other. Therefore, it may be possible to simplify a structure of the semiconductor device.

FIGS. 1 to 8 illustrate an example in which one third semiconductor chip 300 is disposed on the second semiconductor chip 200. However, embodiments of the present inventive concept are not necessarily limited thereto and a plurality of third semiconductor chips 300 may be disposed on the second semiconductor chip 200.

Figure 9:
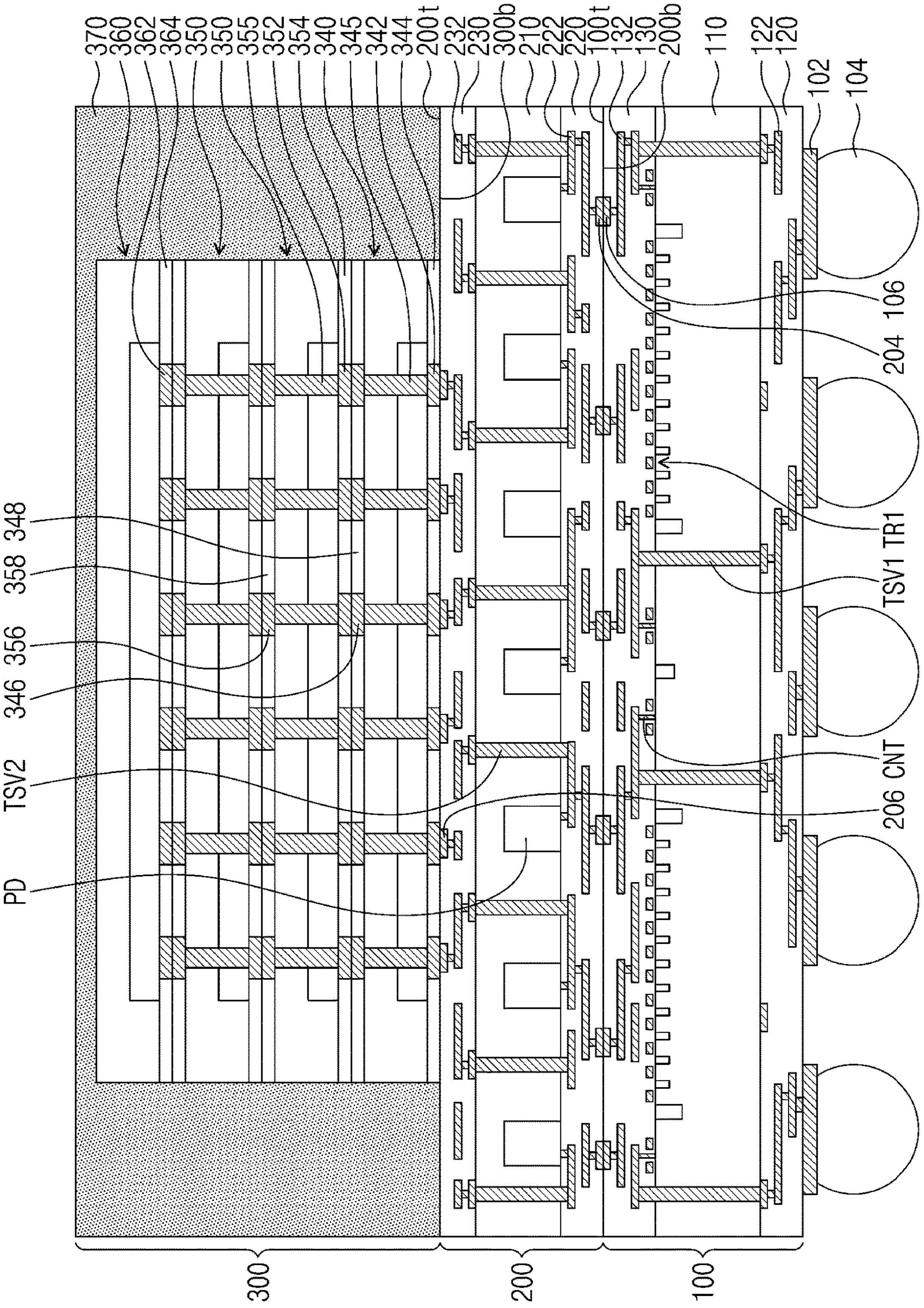
Figure 10:
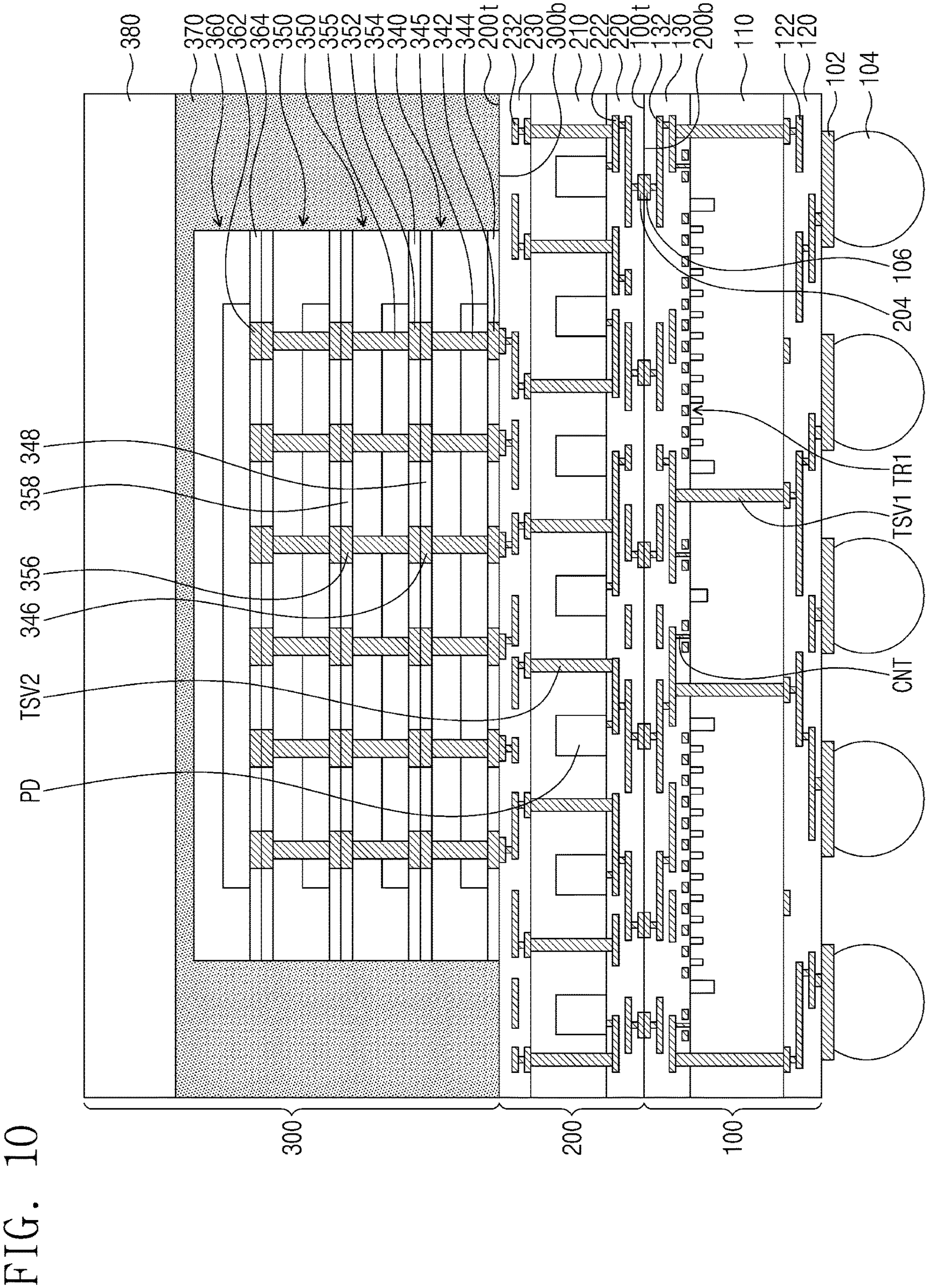

FIGS. 9 and 10 are cross-sectional views illustrating a semiconductor device according to embodiments of the present inventive concept.

Referring to FIG. 9, a chip stack may be disposed on (e.g., disposed directly thereon) the second semiconductor chip 200. In an embodiment, the chip stack may include a plurality of third semiconductor chips 340, 350, and 360. The third semiconductor chips 340, 350, and 360 may be of the same kind. For example, the third semiconductor chips 340, 350, and 360 may each be a memory chip. In an embodiment, the chip stack may include a lower semiconductor chip 340 directly connected to the second semiconductor chip 200, the intermediate semiconductor chips 350 disposed on (e.g., disposed directly thereon) the lower semiconductor chip 340, and an upper semiconductor chip 360 disposed on (e.g., disposed directly thereon) the intermediate semiconductor chips 350. The lower semiconductor chip 340, the intermediate semiconductor chips 350, and the upper semiconductor chip 360 may be sequentially stacked on the second semiconductor chip 200 (e.g., in the vertical direction). The intermediate semiconductor chips 350 may be stacked on top of one another, between the lower semiconductor chips 340 and the upper semiconductor chip 360. In an embodiment shown in FIG. 9, two intermediate semiconductor chips 350 are described to be interposed between the lower semiconductor chip 340 and the upper semiconductor chip 360. However, embodiments of the present inventive concept are not necessarily limited thereto. In an embodiment, one intermediate semiconductor chip or three or more intermediate semiconductor chips may be interposed between the lower semiconductor chip 340 and the upper semiconductor chip 360 or an intermediate semiconductor chip may not be disposed between the lower semiconductor chip 340 and the upper semiconductor chip 360. In some embodiments, the lower semiconductor chip 340 may be considered a third semiconductor chip and the intermediate semiconductor chips and the upper semiconductor chips 360 may be considered a plurality of fourth semiconductor chips.

The lower semiconductor chip 340 may include a first circuit layer 344 that is formed on a semiconductor substrate. The first circuit layer 344 may be provided on (e.g., disposed directly thereon) a bottom surface of the semiconductor substrate. For example, the first circuit layer 344 may be disposed on a surface of the lower semiconductor chip 340 facing the second semiconductor chip 200. The first circuit layer 344 may include a semiconductor device formed on the bottom surface of the semiconductor substrate, a device wiring portion connected to the semiconductor device, and an interlayer insulating layer disposed on the bottom surface of the semiconductor substrate to cover the semiconductor device and the device wiring portion. For example, the bottom surface of the lower semiconductor chip 340 may be an active surface of the lower semiconductor chip 340.

First lower pads 342 may be disposed in the first circuit layer 344. The first lower pads 342 may be electrically connected to the device wiring portion in the first circuit layer 344. The first lower pads 342 may be exposed to the outside of the third semiconductor chip 300 near the near a bottom surface of the first circuit layer 344. Bottom surfaces of the first lower pads 342 may be co-planar with the bottom surface of the first circuit layer 344 (e.g., in the vertical direction). In an embodiment, the first lower pads 342 may be formed of or include at least one of metallic materials. As an example, the first lower pads 342 may include copper (Cu).

The lower semiconductor chip 340 may further include first upper pads 346. The first upper pads 346 may be provided on (e.g., disposed directly thereon) a top surface of the semiconductor substrate. The first upper pads 346 may include a metallic material. As an example, the first upper pads 346 may be formed of or include copper (Cu). The first upper pads 346 on the top surface of the semiconductor substrate may be enclosed by a first upper protection layer 348. For example, the first upper protection layer 348 may cover the top surface of the semiconductor substrate and may enclose the first upper pads 346. The first upper pads 346 may be exposed to the outside of the first upper protection layer 348 near a top surface of the first upper protection layer 348. For example, bottom surfaces of the first upper pads 346 may be exposed to the outside of the first upper protection layer 348 near the top surface of the first upper protection layer 348. In an embodiment, the first upper protection layer 348 may be formed of or include at least one of insulating materials (e.g., silicon nitride (SiN), silicon oxide (SiO), or photosensitive insulating materials).

The lower semiconductor chip 340 may further include first vias 345, which are arranged to vertically penetrate the semiconductor substrate and are connected to (e.g., directly connected thereto) the first circuit layer 344. The first vias 345 may be patterns that are used for vertical interconnection. The first vias 345 may extend to the top surface of the semiconductor substrate and may be coupled to the first upper pads 346. In an embodiment, the first vias 345 may be formed of or include, for example, tungsten (W).

The intermediate semiconductor chips 350 may have substantially the same structure as the lower semiconductor chip 340. For example, each of the intermediate semiconductor chips 350 may include a second circuit layer 354 formed on (e.g., disposed directly thereon) the bottom surface of the semiconductor substrate, second lower pads 352 connected to the second circuit layer 354, second upper pads 356 and a second upper protection layer 358 provided on (e.g., disposed directly thereon) the top surface of the semiconductor substrate, and second vias 355 arranged to vertically penetrate the semiconductor substrate and to connect the second circuit layer 354 to the second upper pads 356.

The upper semiconductor chip 360 may have a structure that is substantially similar to the lower semiconductor chip 340. For example, the upper semiconductor chip 360 may include a third circuit layer 364, which is formed on (e.g., disposed directly thereon) the bottom surface of the semiconductor substrate, and third lower pads 362, which are connected to the third circuit layer 364. In an embodiment, the upper semiconductor chip 360 may not have a via plug, an upper pad, and an upper protection layer. However, embodiments of the present inventive concept are not necessarily limited thereto. For example, in an embodiment, the upper semiconductor chip 360 may include at least one of the via plug, the upper pad, or the upper protection layer. In an embodiment, the upper semiconductor chip 360 may be thicker (e.g., length in the vertical direction) than the lower semiconductor chip 340 and the intermediate semiconductor chips 350.

The intermediate semiconductor chips 350 and the upper semiconductor chip 360 may be sequentially mounted on the lower semiconductor chip 340 (e.g., in the vertical direction). In an embodiment, the mounting of the semiconductor chips 340, 350, and 360 of the chip stack may be performed through the same method. The process of mounting the semiconductor chips 340, 350, and 360 of the chip stack may be described in detail with respect to a mounting process that is performed on the lower semiconductor chip 340 and one of the intermediate semiconductor chips 350.

The intermediate semiconductor chip 350 may be disposed on (e.g., disposed directly thereon) the lower semiconductor chip 340. The first upper pads 346 of the lower semiconductor chip 340 may be vertically aligned to the second lower pads 352 of the intermediate semiconductor chip 350. The lower semiconductor chip 340 and the intermediate semiconductor chip 350, such as a lowest intermediate semiconductor chip 350, may be in direct contact with each other.

At an interface between the lower and intermediate semiconductor chips 340 and 350, the first upper protection layer 348 of the lower semiconductor chip 340 may be bonded to an insulating pattern of the second circuit layer 354 of the intermediate semiconductor chip 350. In an embodiment, the first upper protection layer 348 and the insulating pattern of the second circuit layer 354 may form a hybrid bonding structure of oxide, nitride, or oxynitride. For example, the first upper protection layer 348 and the insulating pattern of the second circuit layer 354 may be formed of the same material, and there may be no interface between the first upper protection layer 348 and the insulating pattern of the second circuit layer 354. Thus, the first upper protection layer 348 and the insulating pattern of the second circuit layer 354 may be provided as a single element. However, embodiments of the present inventive concept are not necessarily limited thereto. In some embodiments, the first upper protection layer 348 and the insulating pattern of the second circuit layer 354 may be formed of different materials from each other. In these embodiments, the first upper protection layer 348 and the insulating pattern of the second circuit layer 354 may not have a continuous structure, and there may be a visible or observable interface between the first upper protection layer 348 and the insulating pattern of the second circuit layer 354.

The lower semiconductor chip 340 may be connected to the intermediate semiconductor chip 350. For example, the lower and intermediate semiconductor chips 340 and 350 may be in contact with each other. At the interface between the lower and intermediate semiconductor chips 340 and 350, the first upper pads 346 of the lower semiconductor chip 340 may be bonded to the second lower pads 352 of the intermediate semiconductor chip 350. In an embodiment, the first upper pads 346 and the second lower pads 352 may form an inter-metal hybrid bonding structure. For example, the first upper pads 346 and the second lower pads 352, which are bonded to each other, may have a continuous structure, and the interface between the first upper pads 346 and the second lower pads 352 may not be visible or observable. For example, the first upper pads 346 and the second lower pads 352 may be formed of the same material, and there may be no interface between the first upper pads 346 and the second lower pads 352. Thus, the first upper pads 346 and the second lower pads 352 may be provided as a single element. For example, the first upper pad 346 and the second lower pad 352 may be bonded to form a single object.

The intermediate semiconductor chips 350, which are adjacent to each other, may be vertically aligned to each other. The intermediate semiconductor chips 350 may be in contact with each other. The intermediate semiconductor chips 350 may be connected to each other. At an interface of the intermediate semiconductor chips 350, the second upper pads 356 of a lower one of the intermediate semiconductor chips 350 may be bonded to the second lower pads 352 of an upper one of the intermediate semiconductor chips 350. In an embodiment, the second upper pads 356 and the second lower pads 352 may form an inter-metal hybrid bonding structure. For example, the second upper pads 356 and the second lower pads 352 may be formed of the same material as each other, and there may be no interface between the second upper pads 356 and the second lower pads 352. Thus, the second upper pads 356 and the second lower pads 352 may be provided as a single element.

The upper one of the intermediate semiconductor chips 350 and the upper semiconductor chip 360 may be vertically aligned to each other. The intermediate semiconductor chip 350 and the upper semiconductor chip 360 may be in contact with each other. The intermediate semiconductor chip 350 and the upper semiconductor chip 360 may be connected to each other. At an interface between the intermediate semiconductor chip 350 and the upper semiconductor chip 360, the second upper pads 356 of the intermediate semiconductor chip 350 may be bonded to the third lower pads 362 of the upper semiconductor chip 360. In an embodiment, the second upper pads 356 and the third lower pads 362 may form an inter-metal hybrid bonding structure. For example, the second upper pads 356 and the third lower pads 362 may be formed of the same material as each other, and there may be no interface between the second upper pads 356 and the third lower pads 362. Thus, the second upper pads 356 and the third lower pads 362 may be provided as a single element.

The chip stack may be mounted on the second semiconductor chip 200. The chip stack may be disposed on the second semiconductor chip 200. The second upper conductive pads 206 of the second semiconductor chip 200 may be vertically aligned to the first lower pads 342 of the lower semiconductor chip 340. In an embodiment, the second semiconductor chip 200 and the lower semiconductor chip 340 may be in direct contact with each other.

At an interface between the second semiconductor chip 200 and the lower semiconductor chip 340, the fourth insulating layer 230 of the second semiconductor chip 200 may be bonded to an insulating pattern of the first circuit layer 344 of the lower semiconductor chip 340. In an embodiment, the fourth insulating layer 230 and the insulating pattern of the first circuit layer 344 may form a hybrid bonding structure of oxide, nitride, or oxynitride. For example, the fourth insulating layer 230 and the insulating pattern of the first circuit layer 344 may be formed of the same material as each other, and there may be no interface between the fourth insulating layer 230 and the insulating pattern of the first circuit layer 344. For example, the fourth insulating layer 230 and the insulating pattern of the first circuit layer 344 may be provided as a single element.

The second semiconductor chip 200 may be connected to the lower semiconductor chip 340. In detail, the second semiconductor chip 200 and the lower semiconductor chip 340 may be in contact with each other. At an interface between the second semiconductor chip 200 and the lower semiconductor chip 340, the second upper conductive pads 206 of the second semiconductor chip 200 may be bonded to the first lower pads 342 of the lower semiconductor chip 340. Here, the second upper conductive pads 206 and the first lower pads 342 may form an inter-metal hybrid bonding structure. For example, the second upper conductive pads 206 and the first lower pads 342, which are bonded to each other, may have a continuous structure, and an interface between the second upper conductive pads 206 and the first lower pads 342 may not be visible or observable. Thus, the second upper conductive pads 206 and the first lower pads 342 may be provided as a single element.

In an embodiment, the chip stack may be mounted on the second semiconductor chip 200 using connection terminals (e.g., solder balls). The connection terminals may be disposed between the second upper conductive pads 206 and the first lower pads 342 to connect the second upper conductive pads 206 to the first lower pads 342. In this embodiment, an under-fill material may be disposed in a space between the chip stack and the second semiconductor chip 200 to enclose the connection terminals.

A mold layer 370 may be provided on (e.g., disposed directly thereon) the second semiconductor chip 200. The mold layer 370 may cover a top surface of the second semiconductor chip 200. The mold layer 370 may enclose the chip stack. For example, the mold layer 370 may cover lateral side surfaces of the semiconductor chips 340, 350, and 360. The mold layer 370 may be formed to cover the chip stack. For example, the mold layer 370 may cover a top surface of the upper semiconductor chip 360. The mold layer 370 may protect the chip stack. The mold layer 370 may include an insulating material. For example, the mold layer 370 may be formed of or include an epoxy molding compound (EMC). However, embodiments of the present inventive concept are not necessarily limited thereto. For example, in an embodiment the mold layer 370 may be arranged to expose a top surface of the chip stack (e.g., the top surface of the upper semiconductor chip 360). In this embodiment, the first semiconductor chip 100, the second semiconductor chip 200, and the mold layer 370 may be arranged to have the same width as each other.

In an embodiment, as shown in FIG. 10, the semiconductor device may further include a dummy semiconductor chip 380 provided on the mold layer 370. For example, the dummy semiconductor chip 380 may be disposed on (e.g., disposed directly thereon) an upper surface of the mold layer 370. The dummy semiconductor chip 380 may include a semiconductor substrate. The semiconductor substrate may include a semiconductor material. In an embodiment the semiconductor substrate may be a silicon substrate. For example, the dummy semiconductor chip 380 may be a chip of bulk silicon. Alternatively, the semiconductor substrate may be formed of or include a material with high thermal conductivity. In an embodiment, the first semiconductor chip 100, the second semiconductor chip 200, the mold layer 370, and the dummy semiconductor chip 380 may have the same width as each other (e.g., length in a horizontal direction parallel to an upper surface of the first semiconductor substrate 110).

In an embodiment, the mold layer 370 and the dummy semiconductor chip 380 may be attached to each other using an adhesive layer. The adhesive layer may be attached to a top surface of the mold layer 370 and a bottom surface of the dummy semiconductor chip 380. In an embodiment in which the top surface of the chip stack is exposed by the top surface of the mold layer 370, the adhesive layer may attach the dummy semiconductor chip 380 to the top surface of the mold layer 370 and the top surface of the chip stack.

However, embodiments of the present inventive concept are not necessarily limited thereto. For example, in an embodiment a heat radiator, instead of the dummy semiconductor chip 380, may be disposed on the chip stack. For example, the heat radiator may be disposed to be in direct contact with the top surface of the mold layer 370. In an embodiment, the heat radiator may be attached to the mold layer 370 using an adhesive film. As an example, the adhesive film may include a thermal interface material (TIM), such as thermal grease. The heat radiator may be used to exhaust heat, which is generated from the semiconductor chips 340, 350, and 360 of the chip stack to the outside. The heat radiator may include a heat sink. In an embodiment, the heat radiator may not be provided.

FIGS. 11 to 19 are cross-sectional views illustrating a method of fabricating a semiconductor device, according to embodiments of the present inventive concept.

Figure 11:
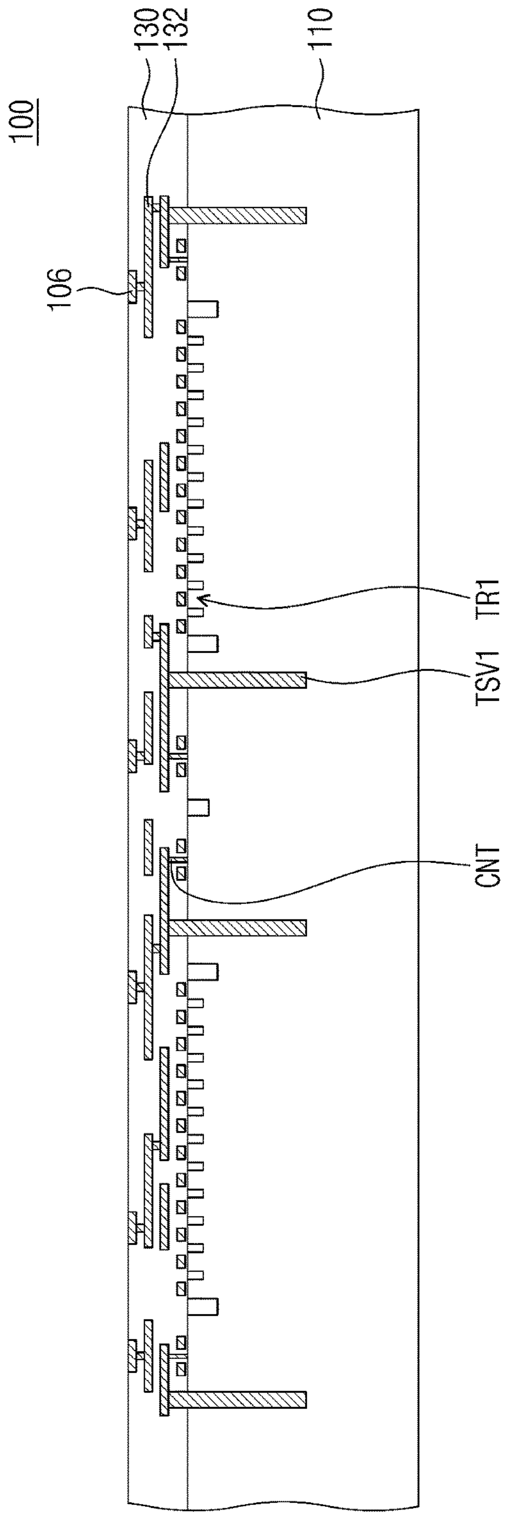
FIGS. 11 to 24 are cross-sectional views illustrating a method of fabricating a semiconductor device, according to embodiments of the present inventive concept.

Referring to FIG. 11, the first semiconductor chip 100 may be formed.

The first semiconductor substrate 110 may be included in the first semiconductor chip 100. The first semiconductor substrate 110 may include a semiconductor material. In an embodiment, the first transistors TR1 may be integrated on the top surface of the first semiconductor substrate 110.

The second insulating layer 130 and the second interconnection patterns 132 may be formed on the first semiconductor substrate 110. In an embodiment, a single insulating layer may be formed by forming an insulating material on the top surface of the first semiconductor substrate 110 to cover the first transistors TR1. In an embodiment, a conductive layer may then be formed on the insulating layer and may be patterned to form one interconnection layer. The processes of forming the insulating layer and the conductive layer may be repeated to form the second insulating layer 130 and the second interconnection patterns 132. The first upper conductive pads 106 may be formed in the uppermost one of the insulating layers, and in an embodiment, the first upper conductive pads 106 may be connected to the second interconnection patterns 132 and may be enclosed by the second insulating layer 130. The second interconnection patterns 132 may be connected to the first transistors TR1. In an embodiment, the second insulating layer 130 may include at least one of insulating materials, such as silicon oxide (SiO), silicon nitride (SiN), or silicon oxynitride (SiON).

In an embodiment, before the formation of the second insulating layer 130 and the second interconnection patterns 132, openings may be formed on the first semiconductor substrate 110. The openings may extend from the top surface of the first semiconductor substrate 110 towards an inner portion of the first semiconductor substrate 110. The first penetration vias TSV1 may then be formed by filling the openings with a conductive material. The second interconnection patterns 132 may be formed to be connected to the first transistors TR1 and the first penetration vias TSV1.

However, embodiments of the present inventive concept are not necessarily limited thereto. For example, in an embodiment openings may be formed in the first semiconductor substrate 110, after the formation of the second insulating layer 130 and the second interconnection patterns 132. The openings may extend from a bottom surface of the first semiconductor substrate 110 towards an inner portion of the first semiconductor substrate 110. Here, the openings may be formed to have bottom surfaces exposing the second interconnection patterns 132. The first penetration vias TSV1 may then be formed by filling the openings with a conductive material. Next, in an embodiment, a semiconductor material or an insulating material may be deposited or grown to cover the bottom surface of the first semiconductor substrate 110 and to bury the first penetration vias TSV1.

Figure 12:
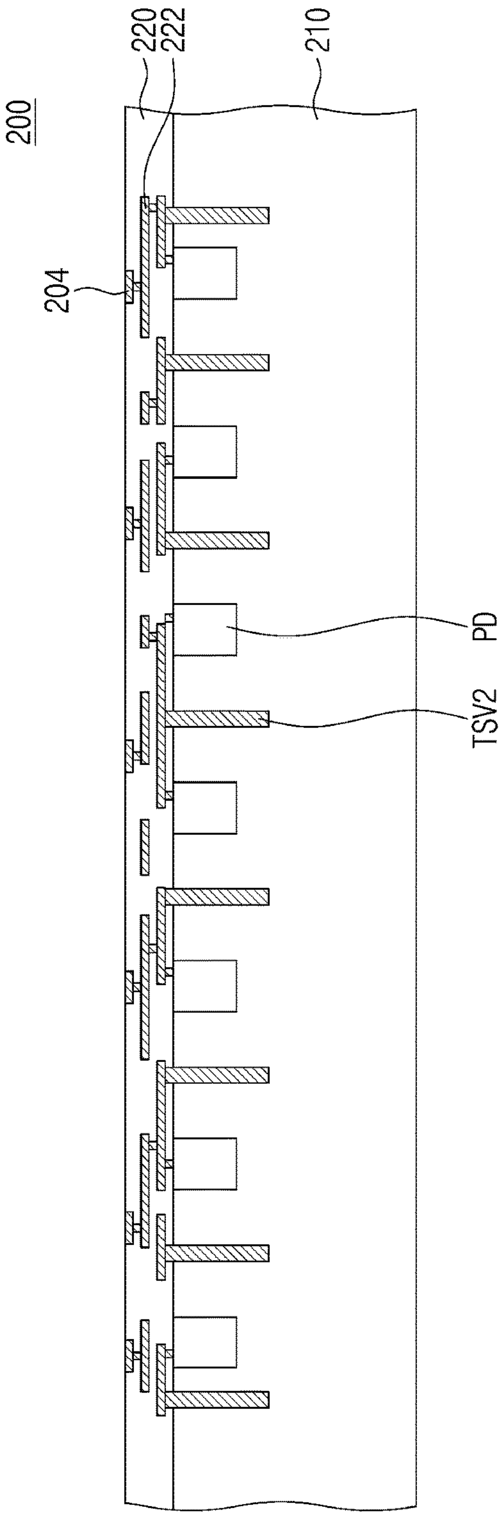

Referring to FIG. 12, the second semiconductor chip 200 may be formed. The fabrication process of the second semiconductor chip 200 may be similar to the fabrication process of the first semiconductor chip 100.

The second semiconductor substrate 210 may be formed on the second semiconductor chip 200. The second semiconductor substrate 210 may include a semiconductor material. In an embodiment, the passive devices PD may be formed on a top surface of the second semiconductor substrate 210.

The third insulating layer 220 and the third interconnection patterns 222 may be formed on the second semiconductor substrate 210. As an example, one insulating layer may be formed on the top surface of the second semiconductor substrate 210 to cover the passive devices PD, and one interconnection layer may be formed on the insulating layer. The processes of forming the insulating layer and the conductive layer may be repeated to form the third insulating layer 220 and the third interconnection patterns 222. The first lower conductive pads 204 may be formed in the uppermost one of the insulating layers and in an embodiment, the first lower conductive pads 204 may be connected to the third interconnection patterns 222 and may be enclosed by the third insulating layer 220. The third interconnection patterns 222 may be connected to the passive devices PD.

In an embodiment, before the formation of the third insulating layer 220 and the third interconnection patterns 222, the second penetration vias TSV2 may be formed by forming openings on the top surface of the second semiconductor substrate 210 and filling the openings with a conductive material.

Alternatively, in an embodiment, after the formation of the third insulating layer 220 and the third interconnection patterns 222, the second penetration vias TSV2 may be formed by forming openings on the bottom surface of the second semiconductor substrate 210 and filling the openings with a conductive material. In an embodiment, a semiconductor material or an insulating material may then be deposited or grown to cover the bottom surface of the second semiconductor substrate 210 and bury the second penetration vias TSV2.

Figure 13:
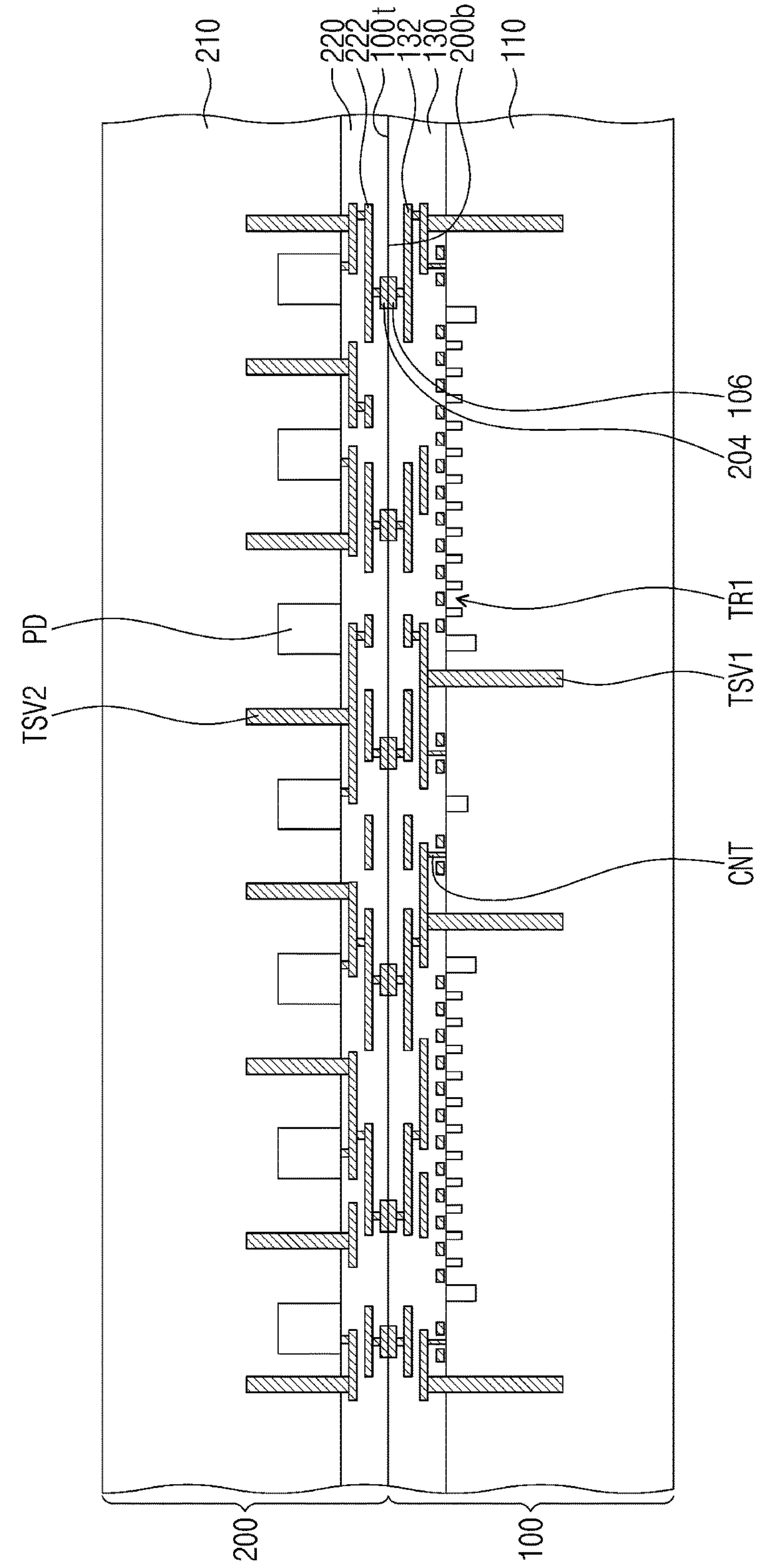

Referring to FIG. 13, the second semiconductor chip 200 may be mounted on (e.g., mounted directly thereon) the first semiconductor chip 100. For example, the first and second semiconductor chips 100 and 200 may be aligned such that the first upper conductive pads 106 of the first semiconductor chip 100 face the first lower conductive pads 204 of the second semiconductor chip 200. In an embodiment, the first and second semiconductor chips 100 and 200 may be placed to be in direct contact with each other, and then, a thermal treatment process may be performed on the first and second semiconductor chips 100 and 200. The first upper conductive pads 106 and the first lower conductive pads 204 may be bonded to each other by the thermal treatment process. For example, in an embodiment the first upper conductive pads 106 and the first lower conductive pads 204 may be bonded to form a single object. The first upper conductive pads 106 and the first lower conductive pads 204 may be bonded to each other in a natural manner. For example, in an embodiment the first upper conductive pads 106 and the first lower conductive pads 204 may be formed of or include the same material as each other (e.g., copper (Cu)) and may be bonded to each other by an intermetal hybrid bonding process caused by a surface activation phenomenon at an interface between the first upper conductive pads 106 and the first lower conductive pads 204, which are in direct contact with each other. The second and third insulating layers 130 and 220 may be bonded to each other by the thermal treatment process.

Figure 14:
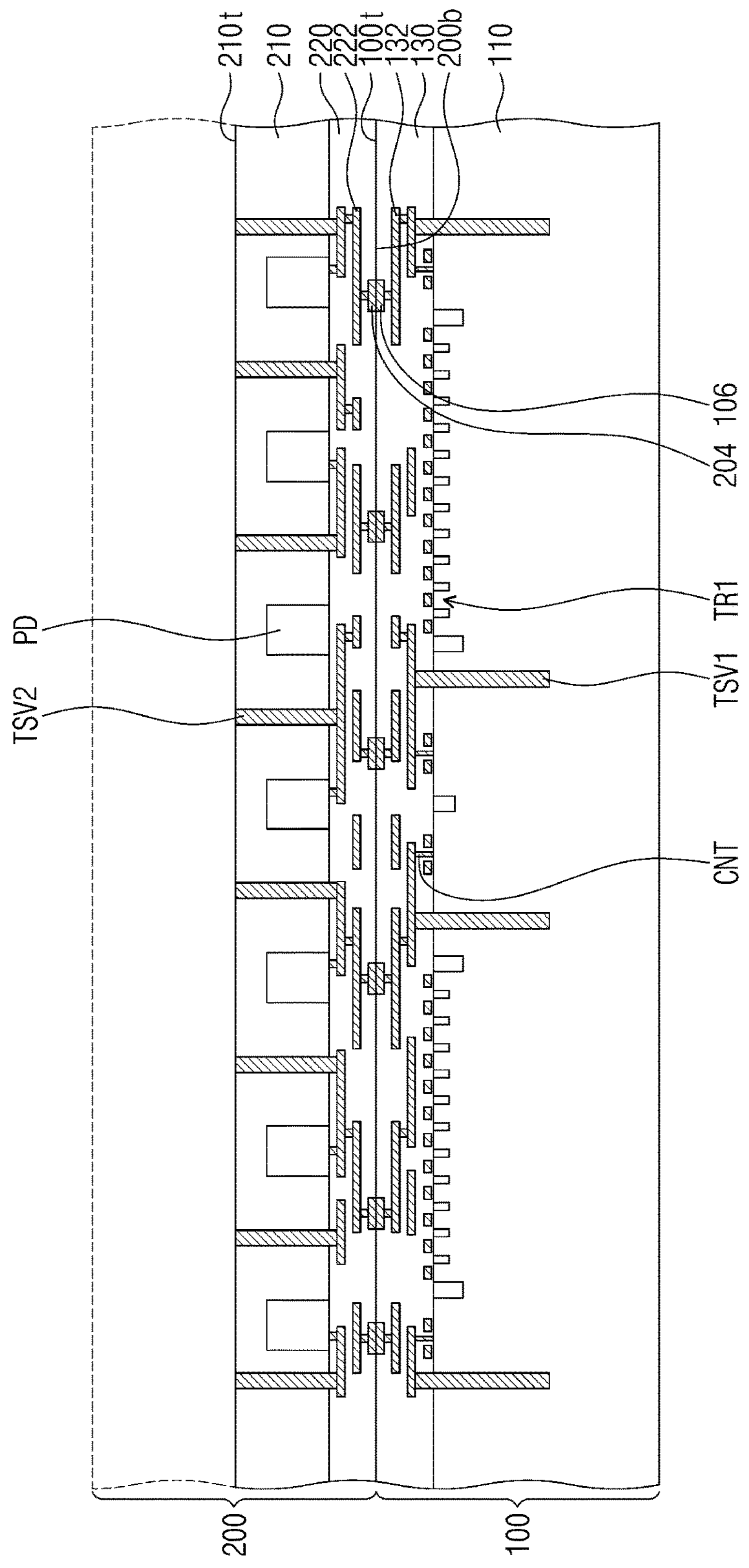

Referring to FIG. 14, a first planarization process may be performed on the second semiconductor chip 200. The first planarization process may be performed on a top surface 210*t* of the second semiconductor substrate 210. For example, in an embodiment the first planarization process may include a chemical mechanical polishing (CMP) process. The first planarization process may be performed to expose surfaces of the second penetration vias TSV2.

Figure 15:
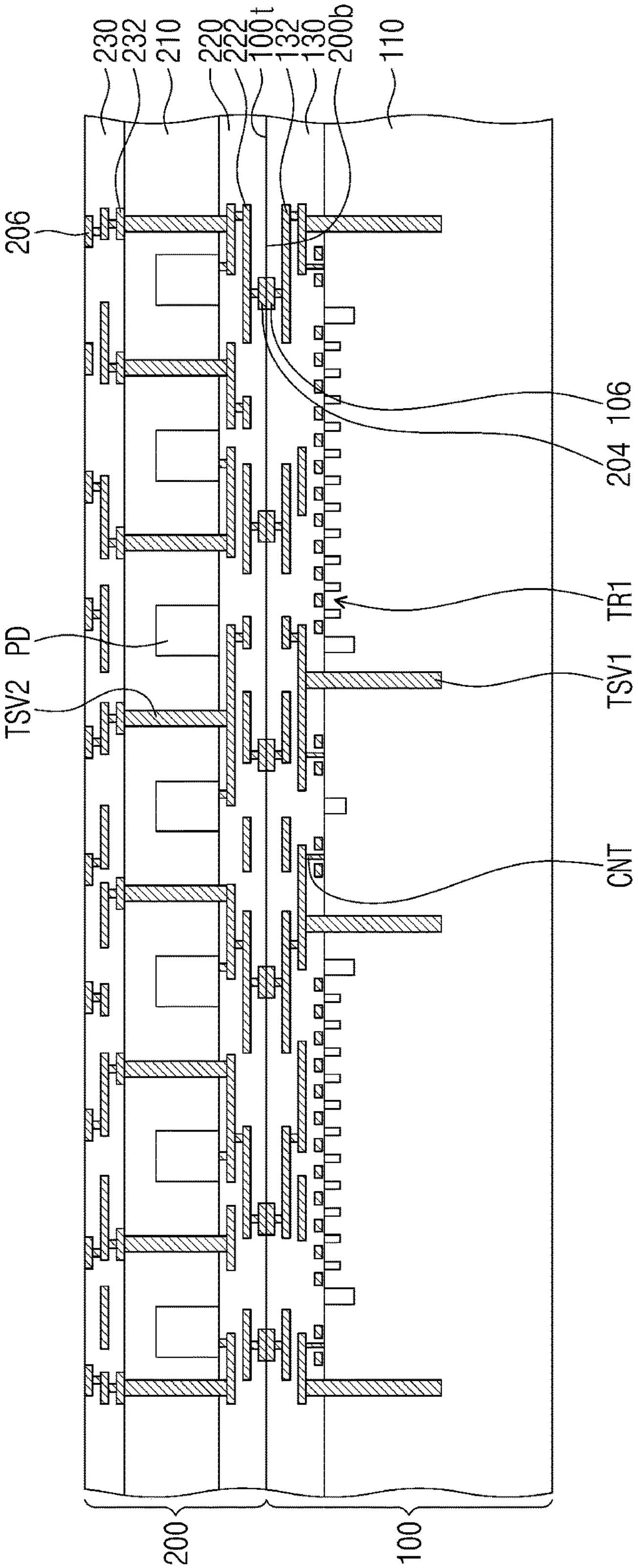

Referring to FIG. 15, the fourth insulating layer 230 and the fourth interconnection patterns 232 may be formed on the second semiconductor chip 200. In an embodiment, an insulating layer may be formed by forming an insulating material on the top surface of the second semiconductor substrate 210. A conductive layer may then be formed on the insulating layer and may be patterned to form one interconnection layer. The processes of forming the insulating layer and the conductive layer may be repeated to form the fourth insulating layer 230 and the fourth interconnection patterns 232. The second upper conductive pads 206 may be formed in the uppermost one of the insulating layers, and in an embodiment, the second upper conductive pads 206 may be connected to the fourth interconnection patterns 232 and may be enclosed by the fourth insulating layer 230. The fourth interconnection patterns 232 may be connected to the second penetration vias TSV2. In an embodiment, the fourth insulating layer 230 may be formed of or include at least one of insulating materials (e.g., silicon oxide (SiO), silicon nitride (SiN), or silicon oxynitride (SiON)).

Figure 16:
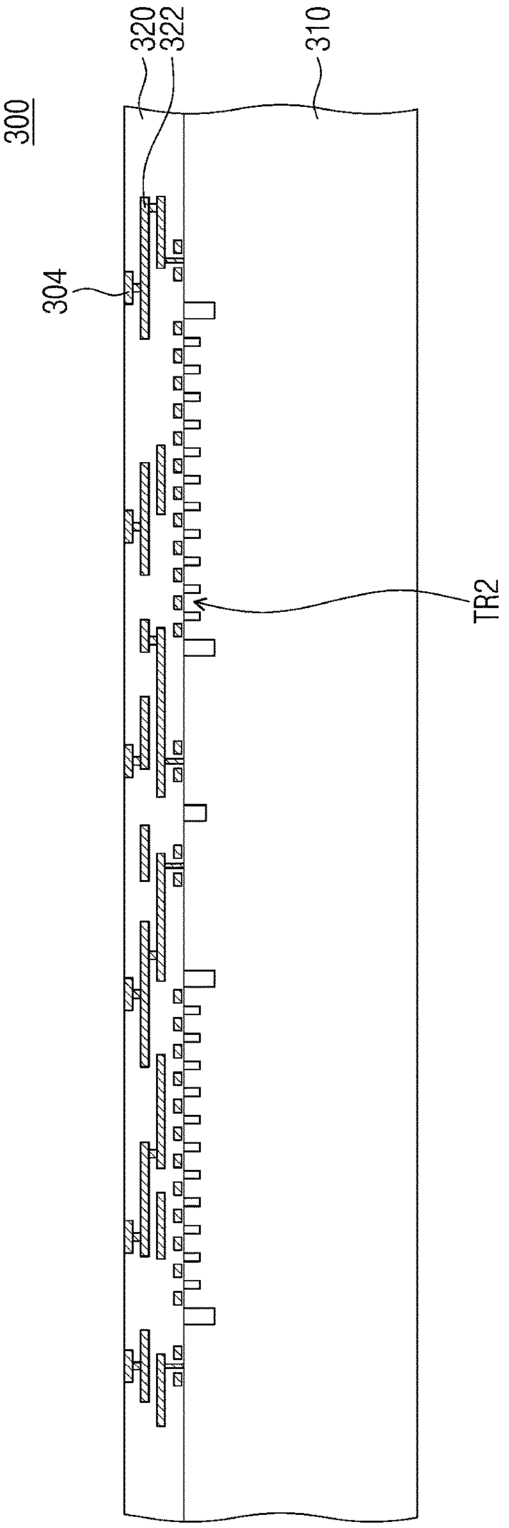

Referring to FIG. 16, the third semiconductor chip 300 may be formed. The process of forming the third semiconductor chip 300 may be similar to the process of forming the first semiconductor chip 100.

The third semiconductor substrate 310 may be formed on the third semiconductor chip 300. The third semiconductor substrate 310 may include a semiconductor material. The second transistors TR2 may be formed on the top surface of the third semiconductor substrate 310.

The fifth insulating layer 320 and the fifth interconnection patterns 322 may be formed on the third semiconductor substrate 310. As an example, an insulating layer may be formed on the top surface of the third semiconductor substrate 310 to cover the second transistors TR2 and an interconnection layer may then be formed on the insulating layer. The processes of forming the insulating layer and the conductive layer may be repeated to form the fifth insulating layer 320 and the fifth interconnection patterns 322. The second lower conductive pads 304 may be formed in the uppermost one of the insulating layers, and in an embodiment, the second lower conductive pads 304 may be connected to the fifth interconnection patterns 322 and may be enclosed by the fifth insulating layer 320. The fifth interconnection patterns 322 may be connected to the second transistors TR2.

Figure 17:
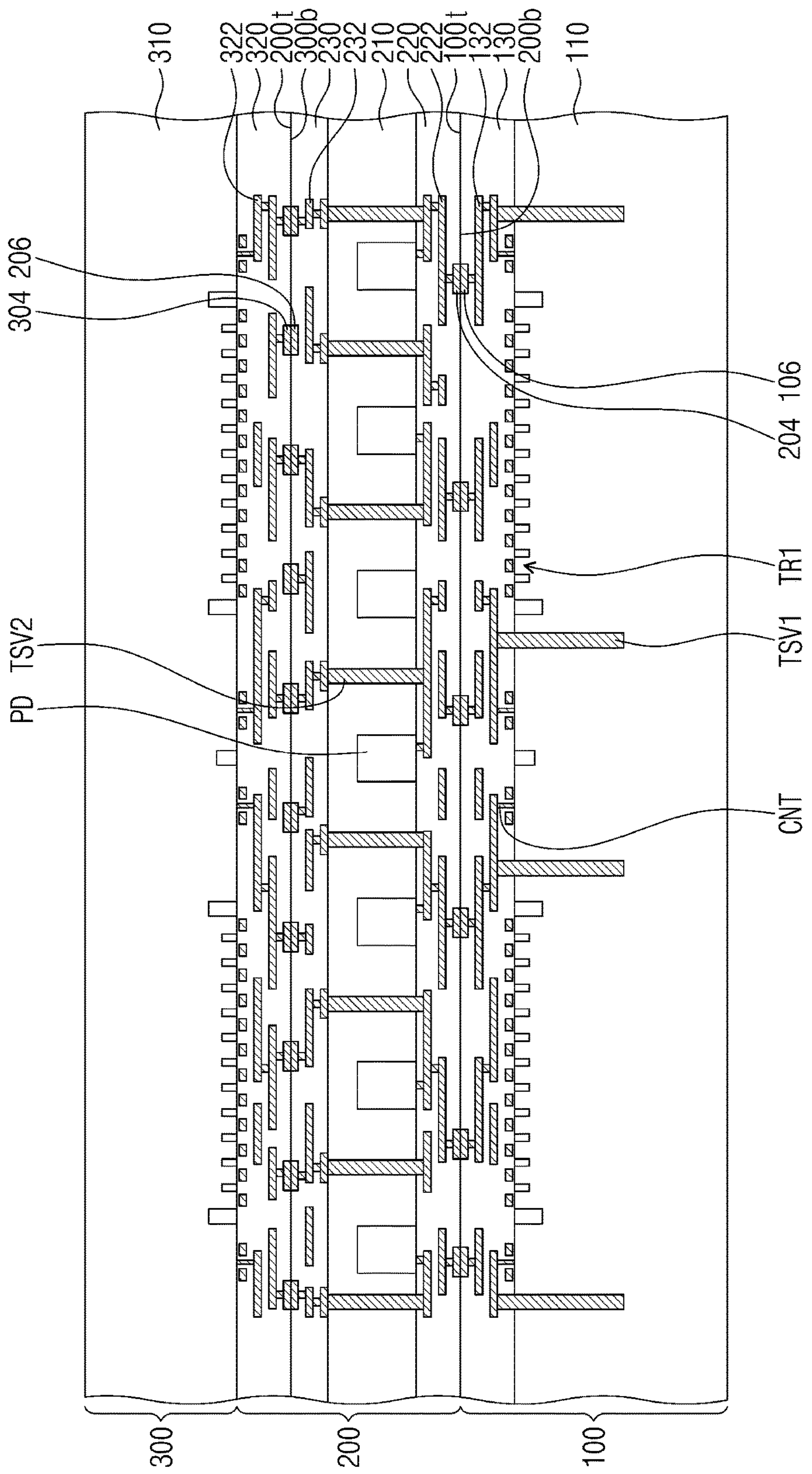

Referring to FIG. 17, the third semiconductor chip 300 may be mounted on (e.g., mounted directly thereon) the second semiconductor chip 200. For example, the second and third semiconductor chips 200 and 300 may be aligned such that the second upper conductive pads 206 of the second semiconductor chip 200 face the second lower conductive pads 304 of the third semiconductor chip 300. In an embodiment, the second and third semiconductor chips 200 and 300 may be placed to be in direct contact with each other, and then, a thermal treatment process may be performed on the second and third semiconductor chips 200 and 300. The second upper conductive pads 206 and the second lower conductive pads 304 may be bonded to each other by the thermal treatment process. In an embodiment, the second upper conductive pads 206 and the second lower conductive pads 304 may be bonded to form a single object. The second upper conductive pads 206 and the second lower conductive pads 304 may be bonded to each other in a natural manner. For example, in an embodiment the second upper conductive pads 206 and the second lower conductive pads 304 may be formed of or include the same material (e.g., copper (Cu)) and may be bonded to each other by an intermetal hybrid bonding process caused by a surface activation phenomenon at an interface between the second upper conductive pads 206 and the second lower conductive pads 304, which are in direct contact with each other. The fourth and fifth insulating layers 230 and 320 may be bonded to each other by the thermal treatment process.

Figure 18:
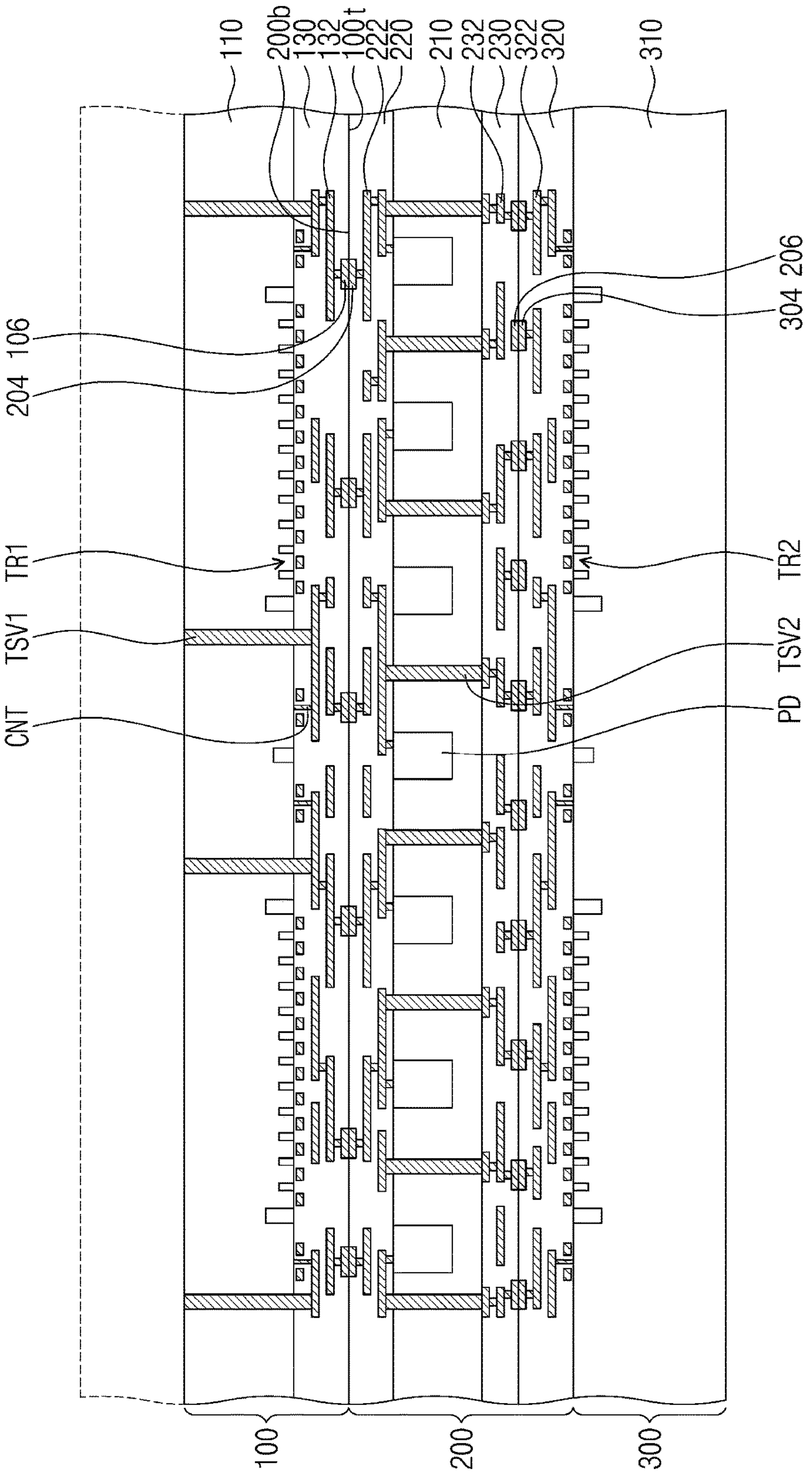

Referring to FIG. 18, the resultant structure of FIG. 17 may be inverted. For example, the second semiconductor chip 200 may be disposed above the third semiconductor chip 300, and the first semiconductor chip 100 may be disposed above the second semiconductor chip 200.

In an embodiment, a second planarization process may then be performed on the first semiconductor chip 100. The second planarization process may be performed on the top surface of the first semiconductor substrate 110. For example, in an embodiment the second planarization process may include a chemical mechanical polishing (CMP) process. The second planarization process may be performed to expose a surface of the first penetration via TSV1.

Figure 19:
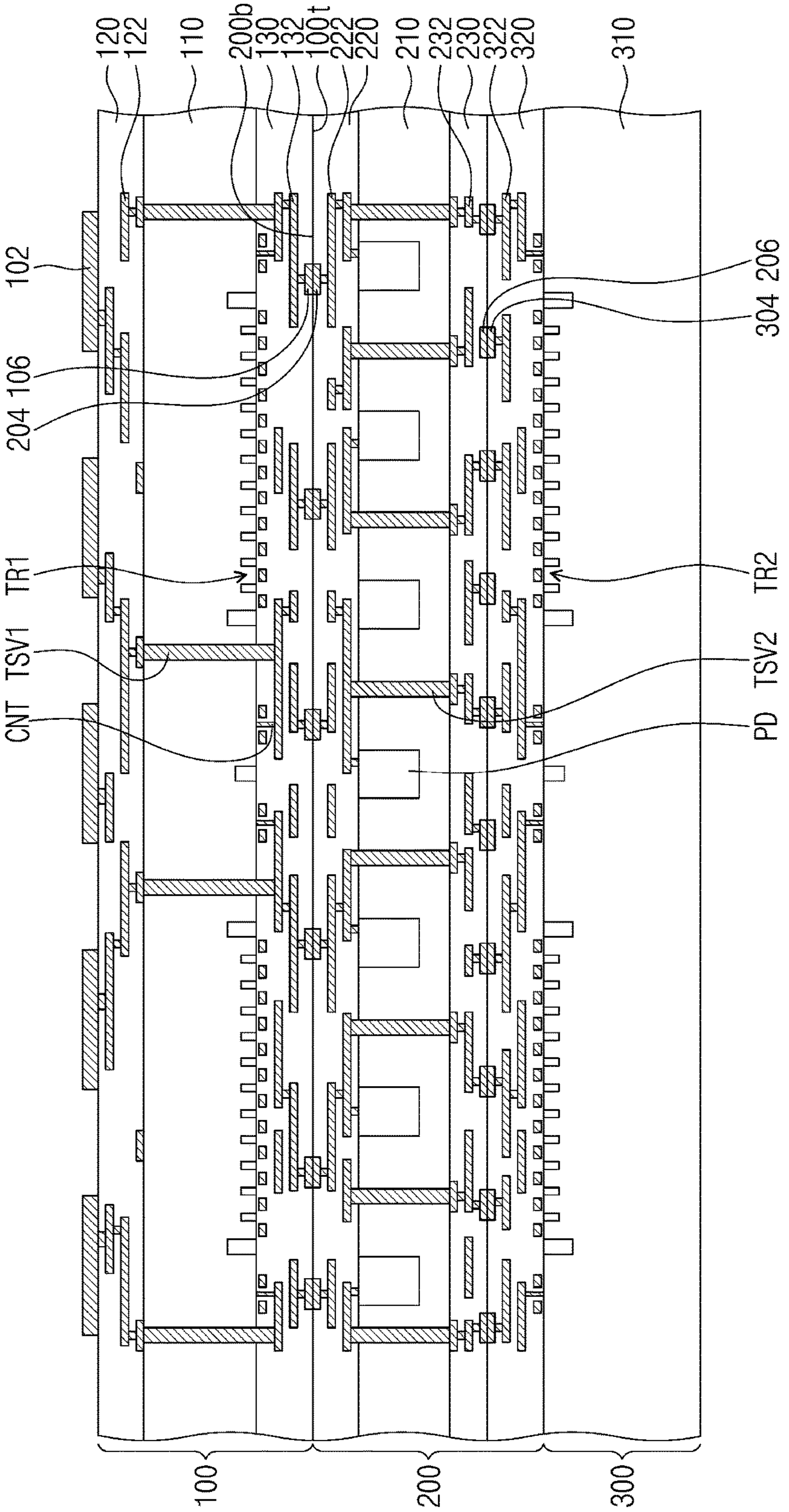

Referring to FIG. 19, the first insulating layer 120 and the first interconnection patterns 122 may be formed on the first semiconductor chip 100. As an example, in an embodiment one insulating layer may be formed by coating the top surface of the first semiconductor substrate 110 with an insulating material. A conductive layer may then be formed on the insulating layer and may be patterned to form one interconnection layer. The processes of forming the insulating layer and the conductive layer may be repeated to form the first insulating layer 120 and the first interconnection patterns 122. The first interconnection patterns 122 may be connected to the first penetration vias TSV1. In an embodiment, the first insulating layer 120 may be formed of or include at least one of insulating materials, such as silicon oxide (SiO), silicon nitride (SiN), and silicon oxynitride (SiON).

The outer pads 102 may be formed on the first insulating layer 120. For example, a conductive layer may be formed on the first insulating layer 120 and may be patterned to form the outer pads 102.

Referring back to FIG. 1, the outer terminals 104 may be disposed below (e.g., disposed directly below) the first insulating layer 120. Each of the outer terminals 104 may be coupled to a corresponding one of the outer pads 102.

A semiconductor device may be fabricated by the previously described method.

In an embodiment, the first, second, and third semiconductor chips 100, 200, and 300 may be fabricated in a wafer level. For example, a plurality of first semiconductor chips 100 may be formed on a first wafer, a plurality of second semiconductor chips 200 may be formed on a second wafer, and a plurality of third semiconductor chips 300 may be formed on a third wafer. In this embodiment, the bonding process between the first to third semiconductor chips 100, 200, and 300 may be achieved through the bonding process between the first to third wafers. After the bonding process between the first to third wafers, a singulation process may be performed on the first to third wafers to form semiconductor devices, which are separated from each other. In this embodiment, since the first to third wafers are cut by the same singulation process, the first to third semiconductor chips 100, 200, and 300 may have the same width as each other.

FIGS. 20 to 24 are cross-sectional views illustrating a method of fabricating a semiconductor device, according to an embodiment of the present inventive concept.

Figure 20:
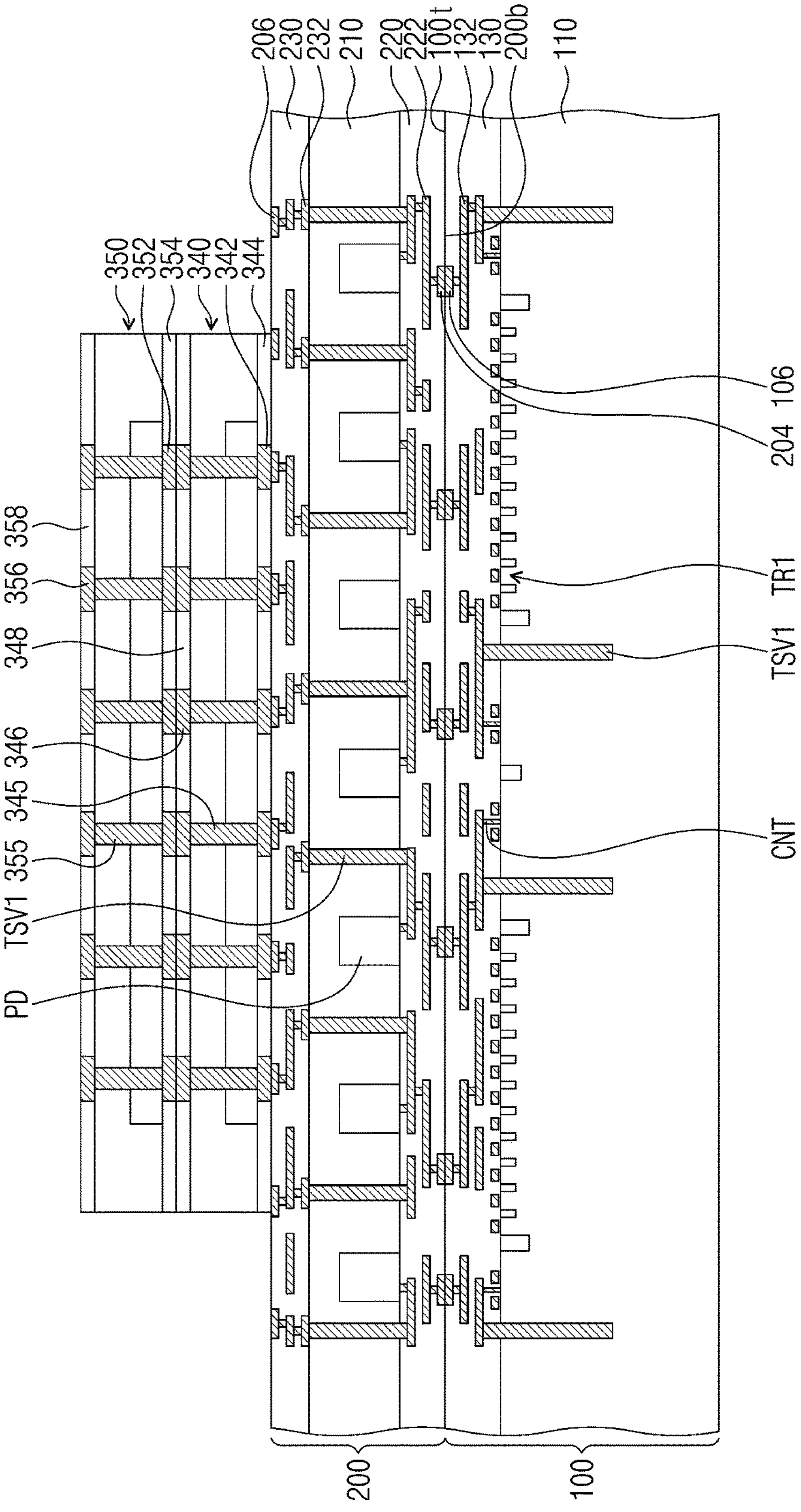

Referring to FIG. 20, semiconductor devices, such as transistors, may be formed on (e.g., formed directly thereon) a front surface of a semiconductor substrate. In an embodiment, a circuit layer 344 or 354 including an interlayer insulating layer and a device wiring portion may be formed by repeatedly performing a process of forming an insulating pattern and an interconnection pattern on the front surface of the semiconductor substrate. A lower pad 342 or 352 may be formed on the circuit layer 344 or 354. A via 345 or 355 may be formed by forming a hole to penetrate the semiconductor substrate and filling the hole with a conductive material. An upper pad 346 or 356 and an upper protection layer 348 or 358 enclosing the upper pad 346 or 356 may be formed on a rear surface of the semiconductor substrate. The lower semiconductor chip 340 or the intermediate semiconductor chips 350 may be formed by the previously described method.

On the resulting structure of FIG. 15, the lower semiconductor chip 340 may be disposed on (e.g., disposed directly thereon) the second semiconductor chip 200. The second upper conductive pads 206 of the second semiconductor chip 200 may be vertically aligned to the first lower pads 342 of the lower semiconductor chip 340. A top surface of the fourth insulating layer 230 of the second semiconductor chip 200 may be in direct contact with a bottom surface of the first circuit layer 344 of the lower semiconductor chip 340, and top surfaces of the second upper conductive pads 206 of the second semiconductor chip 200 may be in direct contact with bottom surfaces of the first lower pads 342 of the lower semiconductor chip 340.

In an embodiment, a thermal treatment process may then be performed on the second semiconductor chip 200 and the lower semiconductor chip 340. The second upper conductive pads 206 and the first lower pads 342 may be bonded to each other by the thermal treatment process. For example, in an embodiment the second upper conductive pads 206 and the first lower pads 342 may be bonded to form a single object. The second upper conductive pads 206 and the first lower pads 342 may be bonded to each other in a natural manner. For example, the second upper conductive pads 206 and the first lower pads 342 may be bonded to each other by an intermetal hybrid bonding process caused by a surface activation phenomenon at an interface between the second upper conductive pads 206 and the first lower pads 342, which are in direct contact with each other.

The intermediate semiconductor chip 350 may be bonded to the lower semiconductor chip 340. The bonding process of the intermediate semiconductor chip 350 may be the same as or similar to the bonding process of the lower semiconductor chip 340. For example, the intermediate semiconductor chip 350 may be disposed on the lower semiconductor chip 340. The first upper pads 346 of the lower semiconductor chip 340 may be vertically aligned to the second lower pads 352 of the intermediate semiconductor chip 350. A thermal treatment process may then be performed on the lower and intermediate semiconductor chips 340 and 350 to bond the first upper pads 346 to the second lower pads 352. In an embodiment, the first upper pads 346 and the second lower pads 352 may be bonded to each other by an intermetal hybrid bonding process caused by a surface activation phenomenon at an interface between the first upper pads 346 and the second lower pads 352, which are in direct contact with each other.

Figure 21:
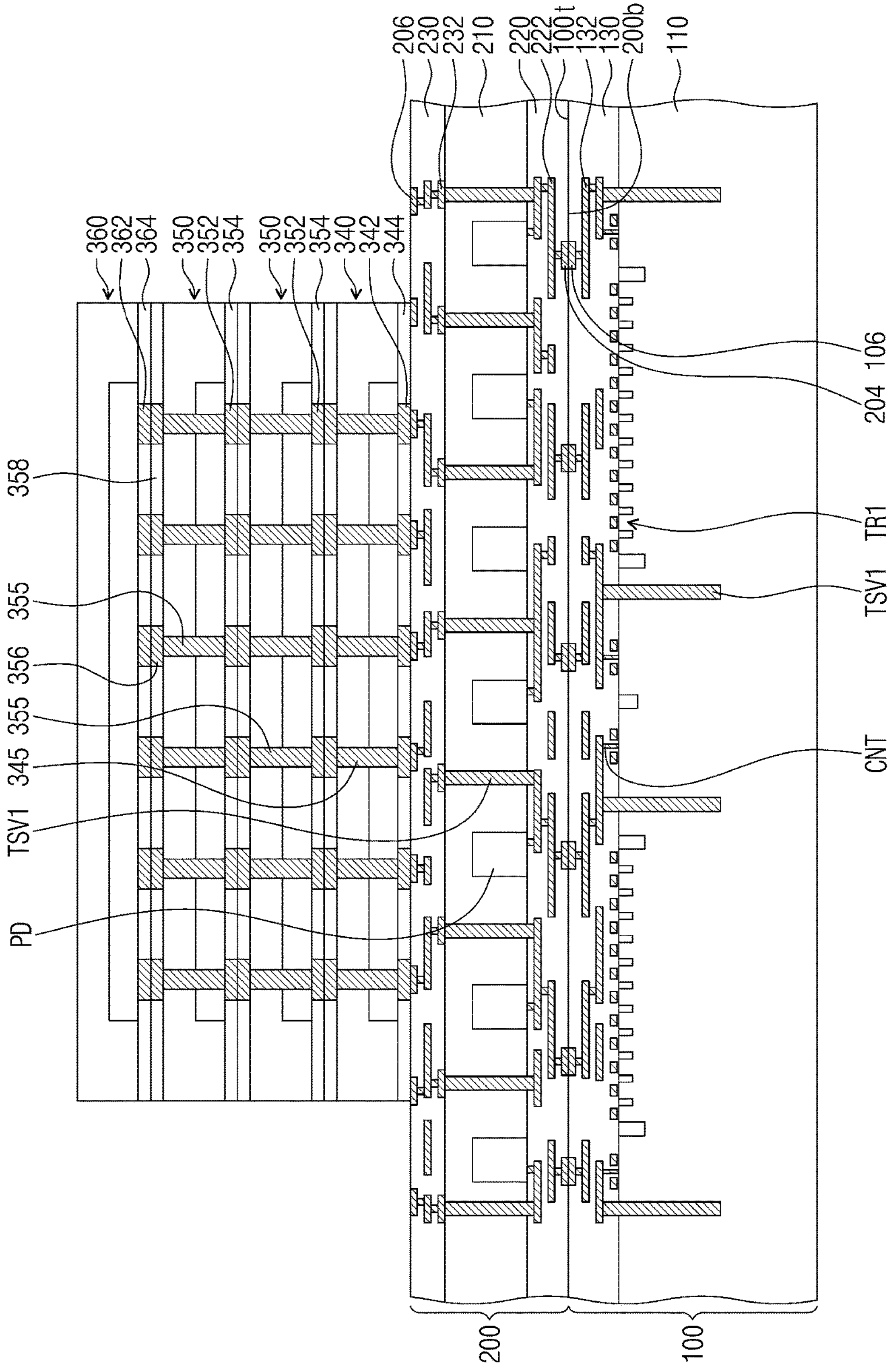

Referring to FIG. 21, another intermediate semiconductor chip 350 may be mounted on (e.g., mounted directly thereon) the intermediate semiconductor chip 350.

Semiconductor devices, such as transistors, may be formed on the front surface of the semiconductor substrate. In an embodiment, the third circuit layer 364 including an interlayer insulating layer and a device wiring portion may be formed by repeatedly performing a process of forming an insulating pattern and an interconnection pattern on the front surface of the semiconductor substrate. The third lower pads 362 may be formed on a surface of the third circuit layer 364. The upper semiconductor chip 360 may be formed by the previously described method.

In an embodiment, the upper semiconductor chip 360 may be placed on (e.g., placed directly thereon) and bonded to the intermediate semiconductor chip 350. The bonding process of the upper semiconductor chip 360 may be the same as or similar to the bonding process of the intermediate semiconductor chip 350. For example, the upper semiconductor chip 360 may be disposed on (e.g., disposed directly thereon) the intermediate semiconductor chip 350. The second upper pads 356 of the intermediate semiconductor chip 350 may be vertically aligned to the third lower pads 362 of the intermediate semiconductor chip 350. A thermal treatment process may then be performed on the intermediate semiconductor chip 350 and the upper semiconductor chip 360 to bond the second upper pads 356 to the third lower pads 362. In an embodiment, the second upper pads 356 and the third lower pads 362 may be bonded to each other by an intermetal hybrid bonding process caused by a surface activation phenomenon at an interface between the second upper pads 356 and the third lower pads 362, which are in direct contact with each other. A chip stack may be formed by the previously described method.

Figure 22:
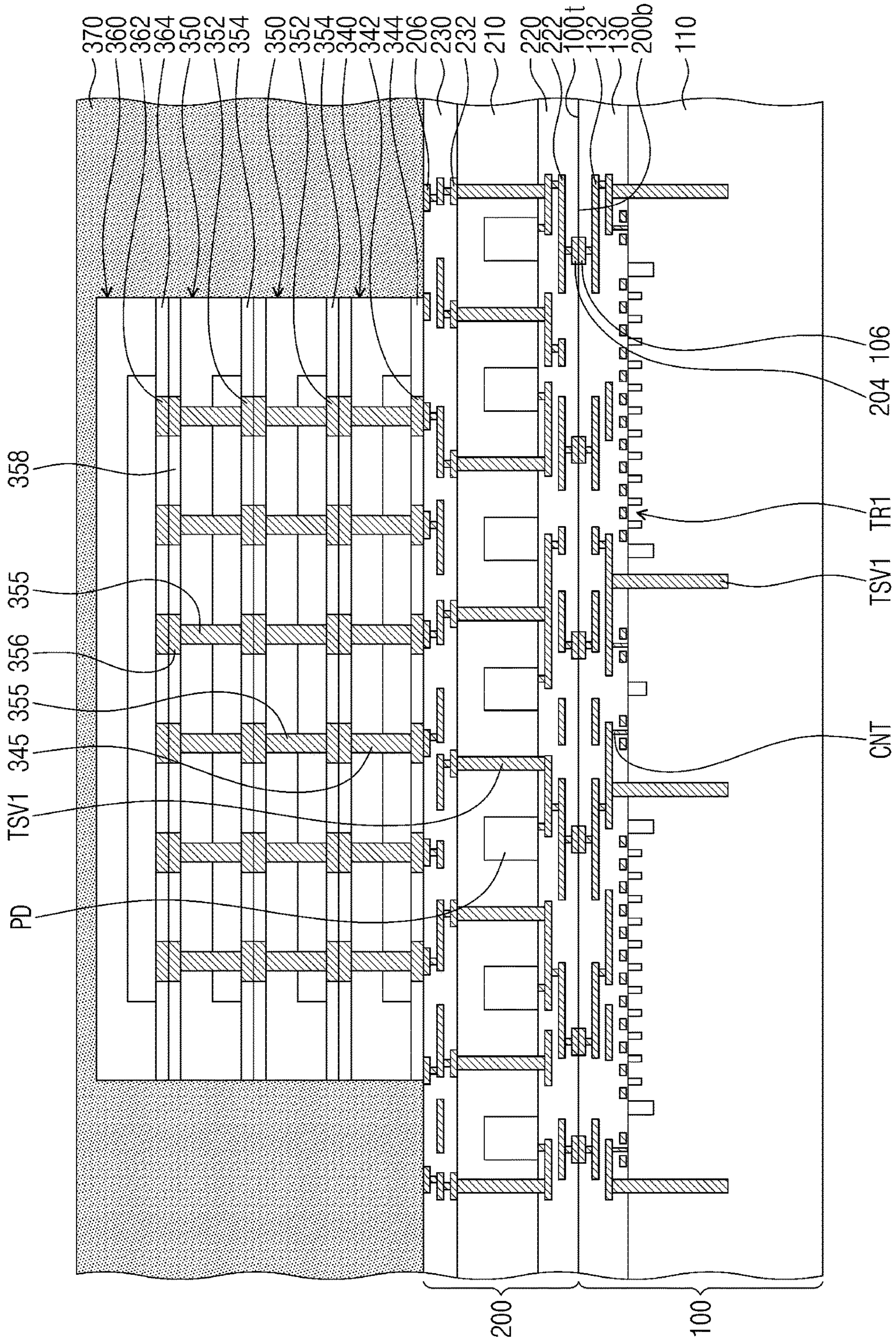

Referring to FIG. 22, the mold layer 370 may be formed by coating an insulating material on the second semiconductor chip 200 to cover the chip stack. The insulating material may cover the top surface of the chip stack, such as the top surface of the upper semiconductor chip 360.

Figure 23:
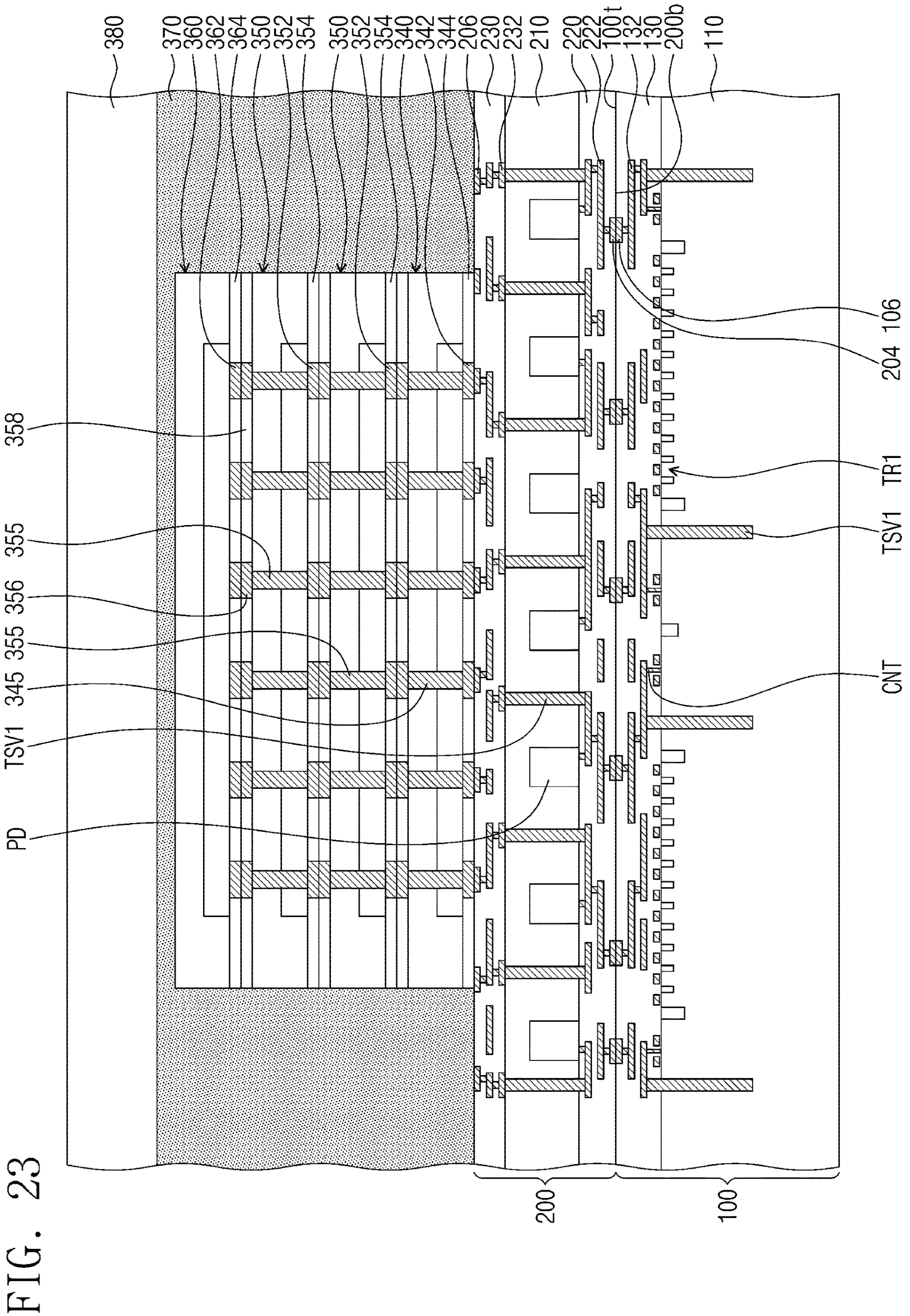

Referring to FIG. 23, the dummy semiconductor chip 380 may be attached to the mold layer 370. In an embodiment, the dummy semiconductor chip 380 may be attached to a top surface of the mold layer 370 using an adhesive member or an adhesive film. However, embodiments of the present inventive concept are not necessarily limited thereto. For example, in an embodiment, the dummy semiconductor chip 380 may not be formed.

Figure 24:
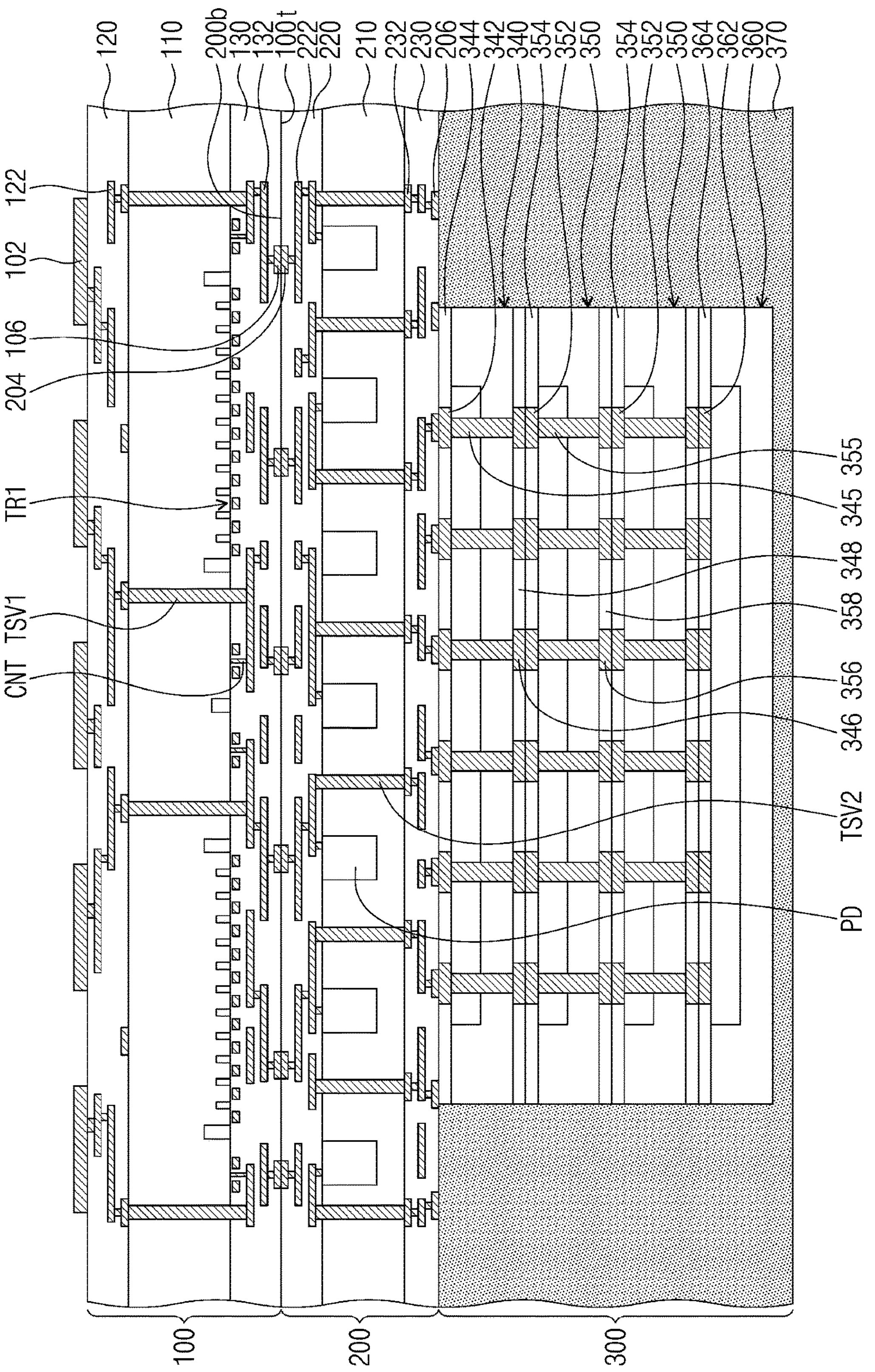

Referring to FIG. 24, the resulting structure of FIG. 23 may be inverted. For example, the second semiconductor chip 200 may be disposed above the chip stack, and the first semiconductor chip 100 may be disposed above the second semiconductor chip 200.

In an embodiment, a second planarization process may be performed on the first semiconductor chip 100. The second planarization process may be performed on the top surface of the first semiconductor substrate 110. For example, in an embodiment the second planarization process may include a chemical mechanical polishing (CMP) process. The second planarization process may be performed to expose a surface of the first penetration via TSV1.

The first insulating layer 120 and the first interconnection patterns 122 may be formed on the first semiconductor chip 100. As an example, in an embodiment one insulating layer may be formed by coating the top surface of the first semiconductor substrate 110 with an insulating material. A conductive layer may then be formed on the insulating layer and may be patterned to form one interconnection layer. The processes of forming the insulating layer and the conductive layer may be repeated to form the first insulating layer 120 and the first interconnection patterns 122. The first interconnection patterns 122 may be connected to the first penetration vias TSV1.

The outer pads 102 may be formed on the first insulating layer 120. For example, in an embodiment a conductive layer may be formed on (e.g., formed directly thereon) the first insulating layer 120 and may be patterned to form the outer pads 102.

Referring back to FIG. 9, the outer terminals 104 may be disposed below the first insulating layer 120. Each of the outer terminals 104 may be coupled to a corresponding one of the outer pads 102.

A semiconductor device may be fabricated by the previously described method.

In an embodiment, the first and second semiconductor chips 100 and 200 may be fabricated in a wafer level. For example, a plurality of first semiconductor chips 100 may be formed on a first wafer, and a plurality of second semiconductor chips 200 may be formed on a second wafer. In this embodiment, the bonding process between the first and second semiconductor chips 100 and 200 may be achieved by a process of bonding the first and second wafers to each other. After the process of bonding the first and second wafers, a plurality of chip stacks may be stacked on the second wafer, and the mold layer 370 may be formed on the second wafer to cover the chip stacks. Thereafter, a singulation process may be performed on the first and second wafers and the mold layer 370 to form semiconductor devices, which are separate from each other. Since the first and second wafers and the mold layer 370 are cut by the same singulation process, the first semiconductor chip 100, the second semiconductor chip 200, and the mold layer 370 may have the same width as each other. In an embodiment in which the dummy semiconductor chip 380 is provided on the mold layer 370, the dummy semiconductor chip 380 may have substantially the same width as the first semiconductor chip 100, the second semiconductor chip 200, and the mold layer 370.

In a semiconductor device according to an embodiment of the present inventive concept, passive devices may be provided as a layer or chip that is distinct from logic circuits or a semiconductor chip with logic circuits. Thus, the passive devices may be provided to have a relatively large area and/or depth, and this may make it possible to increase the electrostatic capacitance of the passive devices. In addition, the passive devices may be freely disposed in a passive device chip, and a layout may be easily designed to reduce a length of an electric path to transistors in a logic chip. Furthermore, the logic chip and the passive device chip may be directly bonded to each other in a face-to-face manner, and in this embodiment, it may be possible to further reduce the length of the electric path between the logic transistors and the passive devices. As a result, the semiconductor device may be provided to have increased electrical characteristics.

A dummy semiconductor chip may be provided on (e.g., disposed directly thereon) the logic chip and the passive device chip. In this embodiment, it may be possible to easily discharge heat, which is generated in the logic chip and the passive device chip, to a region on the semiconductor device through the dummy semiconductor chip. For example, the dummy semiconductor chip may be directly bonded to the passive device chip that has penetration vias extending towards the dummy semiconductor chip, and thus, the heat may be more effectively transferred to the dummy semiconductor chip. Thus, it may be possible to increase the heat-dissipation efficiency of the semiconductor device.

While non-limiting embodiments of the present inventive concept have been particularly shown and described, it will be understood by one of ordinary skill in the art that variations in form and detail may be made therein without departing from the spirit and scope of the present inventive concept.

What is claimed is:

1. A semiconductor device, comprising:

a first semiconductor chip;

a second semiconductor chip on the first semiconductor chip; and a third semiconductor chip on the second semiconductor chip, wherein the first semiconductor chip comprises:

a first semiconductor substrate;

a circuit layer on a top surface of the first semiconductor substrate; and first pads on a top surface of the circuit layer, the first pads are electrically connected to the circuit layer, wherein the second semiconductor chip comprises:

a second semiconductor substrate;

passive devices in the second semiconductor substrate;

second pads on a bottom surface of the second semiconductor substrate, the second pads are electrically connected to the passive devices; and third pads on a top surface of the second semiconductor substrate, wherein the third semiconductor chip comprises fourth pads on a bottom surface of the third semiconductor chip, the first pads and the second pads are directly connected to each other on a contact surface between the first semiconductor chip and the second semiconductor chip, and the third pads and the fourth pads are directly connected to each other on a contact surface between the second semiconductor chip and the third semiconductor chip, the second semiconductor chip further comprises penetration vias vertically penetrating the second semiconductor substrate and connecting the second pads to the third pads, and the passive devices are electrically connected to the respective penetration vias through interconnection patterns that are arranged between the second semiconductor substrate and the circuit layer of the first semiconductor chip.

2. The semiconductor device of claim 1, wherein the first semiconductor chip further comprises:

penetration vias vertically penetrating the first semiconductor substrate and connected to the circuit layer;

fifth pads on a bottom surface of the first semiconductor substrate and connected to the penetration vias of the first semiconductor chip; and outer terminals directly coupled to the fifth pads.

3. The semiconductor device of claim 1, wherein a width of the first semiconductor chip, a width of the second semiconductor chip, and a width of the third semiconductor chip are equal to each other.

4. The semiconductor device of claim 1, wherein:

the second semiconductor chip further comprises an interconnection layer disposed on the bottom surface of the second semiconductor substrate, the interconnection layer electrically connecting the passive devices to the second pads; and an insulating pattern of the circuit layer and an insulating pattern of the interconnection layer are in direct contact with each other on the contact surface between the first semiconductor chip and the second semiconductor chip.

5. The semiconductor device of claim 1, wherein the passive devices are disposed to be closer to the bottom surface of the second semiconductor substrate than to the top surface of the second semiconductor substrate.

6. The semiconductor device of claim 1, wherein:

the circuit layer comprises a logic circuit; and each of the passive devices comprises a capacitor.

7. The semiconductor device of claim 6, wherein:

the passive device is disposed in a recess formed on the bottom surface of the second semiconductor substrate and includes a first electrode and a second electrode, which are horizontally spaced apart from each other in the recess and respectively connected to first and second passive device pads of the interconnection patterns, and a dielectric material is disposed to fill a space between the first and second electrodes.

8. The semiconductor device of claim 6, wherein the third semiconductor chip comprises a dummy semiconductor chip or a memory semiconductor chip.

9. The semiconductor device of claim 1, further comprising:

a plurality of fourth semiconductor chips stacked on the third semiconductor chip;

a mold layer on the second semiconductor chip, the mold layer enclosing the third semiconductor chip and the fourth semiconductor chips; and a dummy semiconductor chip disposed on a top surface of the mold layer.

10. The semiconductor device of claim 9, wherein:

the first semiconductor chip comprises a logic chip; and each of the third and fourth semiconductor chips comprise a memory chip.

11. The semiconductor device of claim 9, wherein a width of the first semiconductor chip, a width of the second semiconductor chip, a width of the mold layer, and a width of the dummy semiconductor chip are equal to each other.

12. The semiconductor device of claim 1, wherein:

the first pads and the second pads are composed of a same material as each other to form a single object on the contact surface between the first semiconductor chip and the second semiconductor chip;

the third pads and the fourth pads are composed of a same material as each other to form a single object on the contact surface between the second semiconductor chip and the third semiconductor chip.

13. A semiconductor device, comprising:
a logic chip;
a passive device chip on the logic chip; and
a chip stack on the passive device chip,
wherein a front surface of the logic chip and a front surface of the passive device chip face each other and are in direct contact with each other,
wherein the chip stack comprises:
memory chips stacked on a rear surface of the passive device chip; and
a mold layer on the rear surface of the passive device chip, the mold layer covering the memory chips,
wherein a lowermost one of the memory chips is directly mounted on the rear surface of the passive device chip,
wherein the logic chip comprises:
a first semiconductor substrate;
a circuit layer on a top surface of the first semiconductor substrate; and
a first interconnection layer on a bottom surface of the first semiconductor substrate,
wherein the passive device chip comprises:
a second semiconductor substrate;
a passive device below the second semiconductor substrate;
penetration vias vertically penetrating the second semiconductor substrate; and
a second interconnection layer disposed on a bottom surface of the second semiconductor substrate and electrically connected to the passive device and the penetration vias, and
wherein the circuit layer of the logic chip and the second interconnection layer of the passive device chip are in direct contact with each other.

14. The semiconductor device of claim 13, wherein a width of the logic chip, a width of the passive device chip, and a width of the chip stack are equal to each other.

15. The semiconductor device of claim 13, wherein first pads disposed in the circuit layer and second pads disposed in the second interconnection layer include a same material as each other to form a single object.

16. The semiconductor device of claim 13, wherein a first insulating pattern disposed in the circuit layer is in direct contact with a second insulating pattern disposed in the second interconnection layer.

17. The semiconductor device of claim 13, wherein the lowermost one of the memory chips is directly mounted on the penetration vias or on pads disposed on a top surface of the second semiconductor substrate to electrically connect with the penetration vias.

18. The semiconductor device of claim 13, further comprising outer terminals on a bottom surface of the first interconnection layer.

19. The semiconductor device of claim 13, further comprising a dummy semiconductor chip on the chip stack,
wherein the dummy semiconductor chip is attached to the mold layer.

20. A semiconductor device, comprising:
a first semiconductor chip;
a second semiconductor chip on the first semiconductor chip;
third semiconductor chips stacked on the second semiconductor chip; and
a mold layer on the second semiconductor chip, the mold layer enclosing the third semiconductor chips,
wherein the first semiconductor chip comprises:
a first semiconductor substrate; and
a logic circuit layer on a top surface of the first semiconductor substrate,
wherein the second semiconductor chip comprises:
a second semiconductor substrate;
a passive device in the second semiconductor substrate, the passive device is disposed to be closer to a bottom surface of the second semiconductor substrate than to a top surface of the second semiconductor substrate;
an interconnection layer on the bottom surface of the second semiconductor substrate, the interconnection layer is electrically connected to the passive device; and
penetration vias vertically penetrating the second semiconductor substrate, the penetration vias are electrically connected to the interconnection layer,
wherein the logic circuit layer and the interconnection layer are in direct contact with each other, and
a lowermost third semiconductor chip of the third semiconductor chips is mounted on the penetration vias or pads disposed on the top surface of the second semiconductor substrate to electrically connect with the penetration vias.

* * * * *